US009385762B2

(12) United States Patent
Laporte et al.

(10) Patent No.: US 9,385,762 B2
(45) Date of Patent: *Jul. 5, 2016

(54) LINEARIZATION OF INTERMODULATION BANDS FOR CONCURRENT DUAL-BAND POWER AMPLIFIERS

(71) Applicant: Telefonaktiebolaget L M Ericsson (publ), Stockholm (SE)

(72) Inventors: Pierre-Andre Laporte, Gatineau (CA); Mark Edward Rollins, Stittsville (CA); Haiying Cao, Solna (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 45 days.

This patent is subject to a terminal disclaimer.

(21) Appl. No.: 14/093,755

(22) Filed: Dec. 2, 2013

(65) Prior Publication Data

US 2015/0049841 A1 Feb. 19, 2015

Related U.S. Application Data

(63) Continuation-in-part of application No. 13/969,858, filed on Aug. 19, 2013.

(60) Provisional application No. 61/826,060, filed on May 22, 2013.

(51) Int. Cl.
*H04B 1/04* (2006.01)
*H04M 1/00* (2006.01)
(Continued)

(52) U.S. Cl.
CPC ............ *H04B 1/0475* (2013.01); *H03F 1/3241* (2013.01); *H04B 1/0067* (2013.01);
(Continued)

(58) Field of Classification Search
CPC ...... H04B 1/04; H04B 1/0475; H04B 1/0483; H04B 2201/0425; H04B 2001/0433; H04L 27/367; H04L 27/368; H04L 2025/03414; H03F 1/3241; H03F 1/3247; H03F 1/3258; H03F 3/189; H03F 2200/111; H03F 2201/3227; H03F 2201/3233

USPC ............ 455/63.1, 67.13, 114.2, 114.3, 127.2, 455/552.1; 375/296, 297
See application file for complete search history.

(56) References Cited

U.S. PATENT DOCUMENTS 6,057,793 A  5/2000  Gong et al.
6,125,266 A * 9/2000  Matero et al. ................. 455/126
(Continued)

FOREIGN PATENT DOCUMENTS

EP    2369362 A1   9/2011
WO   2010136114 A1  12/2010

OTHER PUBLICATIONS

International Search Report and Written Opinion for PCT/IB2014/061160, mailed Nov. 28, 2014, 16 pages.
(Continued)

*Primary Examiner* — Quochien B Vuong
(74) *Attorney, Agent, or Firm* — Withrow & Terranova, PLLC

(57) ABSTRACT

Systems and methods are disclosed for digital predistortion for a concurrent multi-band transmitter that compensates for both in-band and out-of-band intermodulation products according to a memory polynomial based baseband model. In one embodiment, a concurrent multi-band transmitter includes a digital predistortion subsystem, power amplifier circuitry, and an adaptation subsystem. The digital predistortion subsystem includes multiple digital predistorters configured to process digital input signals for frequency bands of a concurrent multi-band signal to provide predistorted digital input signals each being for a different one of the frequency bands of the concurrent multi-band signal and one or more intermodulation distortion compensation signals each being for a different one of one or more intermodulation distortion frequency bands. The adaptation subsystem is configured to adaptively configure the plurality of digital predistorters according to a memory polynomial based digital baseband model of the digital predistorters.

27 Claims, 16 Drawing Sheets

(51) Int. Cl.
*H04L 25/03* (2006.01)
*H03F 1/32* (2006.01)
*H04B 1/00* (2006.01)
*H04B 1/62* (2006.01)

(52) U.S. Cl.
CPC ........ *H04B1/0483* (2013.01); *H03F 2200/111* (2013.01); *H04B 1/0053* (2013.01); *H04B 1/62* (2013.01); *H04B 2001/0425* (2013.01); *H04B 2001/0433* (2013.01)

(56) References Cited

U.S. PATENT DOCUMENTS

| | | | |
|---|---|---|---|
| 6,452,982 | B1 | 9/2002 | O'Dell et al. |
| 6,549,067 | B1 | 4/2003 | Kenington |
| 6,956,433 | B2 | 10/2005 | Kim et al. |
| 6,999,523 | B2 | 2/2006 | Posti |
| 7,136,430 | B2 | 11/2006 | Morris et al. |
| 7,142,615 | B2 * | 11/2006 | Hongo et al. ............ 375/297 |
| 7,170,342 | B2 * | 1/2007 | Suzuki et al. ............ 330/149 |
| 7,170,344 | B2 | 1/2007 | Suzuki et al. |
| 7,183,847 | B2 | 2/2007 | Suzuki et al. |
| 7,236,110 | B2 | 6/2007 | Antonesei |
| 7,466,247 | B1 | 12/2008 | Gorbics |
| 7,539,464 | B2 | 5/2009 | Suzuki et al. |
| 7,634,238 | B2 | 12/2009 | Suzuki et al. |
| 7,848,717 | B2 * | 12/2010 | Liu ............ 455/114.3 |
| 8,149,950 | B2 | 4/2012 | Kim et al. |
| 8,289,195 | B1 | 10/2012 | Dong et al. |
| 8,351,877 | B2 | 1/2013 | Kim et al. |
| 8,380,144 | B1 | 2/2013 | Bai et al. |
| 8,391,809 | B1 | 3/2013 | Fuller |
| 8,416,111 | B2 | 4/2013 | Pagnanelli |
| 2003/0053552 | A1 | 3/2003 | Hongo et al. |
| 2003/0053558 | A1 | 3/2003 | Unger et al. |
| 2005/0160124 | A1 | 7/2005 | Bisiaux |
| 2010/0098191 | A1 | 4/2010 | Morris et al. |
| 2010/0316157 | A1 | 12/2010 | Bassam et al. |
| 2011/0235749 | A1 | 9/2011 | Kenington |
| 2012/0069931 | A1 | 3/2012 | Gandhi et al. |
| 2012/0154038 | A1 | 6/2012 | Kim et al. |
| 2012/0328050 | A1 | 12/2012 | Bai et al. |
| 2013/0094610 | A1 | 4/2013 | Ghannouchi et al. |
| 2013/0241757 | A1 | 9/2013 | Morris |
| 2014/0009225 | A1 | 1/2014 | Laporte |
| 2014/0219392 | A1 | 8/2014 | Chen et al. |

OTHER PUBLICATIONS

International Search Report and Written Opinion for PCT/IB2014/061161, mailed Nov. 26, 2014, 17 pages.
Bassam, Seyed Aidin et al., "2-D Digital Predistortion (2-D-DPD) Architecture for Concurrent Dual-Band Transmitters," IEEE Transactions on Microwave Theory and Techniques, vol. 59, No. 10, Oct. 2011, pp. 2547-2553.
Bassam, Seyed Aidin et al., "Channel-Selective Multi-Cell Digital Predistorter for Multi-Carrier Transmitters," IEEE Transactions on Communications, vol. 60, No. 8, Aug. 2012, pp. 2344-2352.
Caffee, Sean, "Continuously Variable Fractional Rate Decimator," XILINX XAPP936, v1.1, Mar. 5, 2007, pp. 1-11.
Cidronali, A. et al., "A New Approach for Concurrent Dual-Band IF Digital PreDistortion: System Design and Analysis," Workshop on Integrated Nonlinear Microwave and Millimetre-Wave Circuits, Nov. 24-25, 2008, 4 pages, Malaga, Spain.
Cidronali, Alessandro "Dual-Band Power Amplifiers for WiMAX and WCDMA Applications," Target Day Programme 2007, Dec. 17, 2007, 51 pages, Florence, Italy.
Ding, Lei et al., "Concurrent Dual-band Digital Predistortion," 2012 IEEE MTT-S International Microwave Symposium Digest (MTT), Jun. 17-22, 2012, 3 pages, Montreal, Canada.
Jiang, Hong et al., "Digital Predistortion Using Stochastic Conjugate Gradient Method," IEEE Transactions on Broadcasting, vol. 58, No. 1, Mar. 2012, pp. 114-124.
Kim, J. et al., "Digital predistortion of wideband signals based on power amplifier model with memory," Electronics Letters, vol. 37, No. 23, Nov. 8, 2001, pp. 1417-1418.
Liu, Y.-J. et al., "2D augmented Hammerstein model for concurrent dual-band power amplifiers," Electronics Letters, vol. 48, No. 19, Sep. 13, 2012, 2 pages.
Liu, Y.-J. et al., "Low-complexity 2D behavioural model for concurrent dual-band power amplifiers," Electronics Letters, vol. 48, No. 11, May 24, 2012, 2 pages.
Liu, You-Jiang et al., "Behavioral Modeling for Concurrent Dual-band Power Amplifiers Using 2D Hammerstein/Wiener Models," International Journal of RF and Microwave Computer-Aided Engineering, vol. 23, No. 6, Nov. 14, 2013, 9 pages.
Liu, You-Jiang et al., "Digital Predistortion for Concurrent Dual-Band Transmitters Using 2-D Modified Memory Polynomials," IEEE Transactions on Microwave Theory and Techniques, vol. 61, No. 1, Jan. 2013, pp. 281-290.
Younes, Mayada et al., "An Accurate Complexity-Reduced "PLUME" Model for Behavioral Modeling and Digital Predistortion of RF Power Amplifiers," IEEE Transactions on Industrial Electronics, vol. 58, No. 4, Apr. 2011, pp. 1397-1405.
Younes, Mayada et al., "On the Modeling and Linearization of a Concurrent Dual-Band Transmitter Exhibiting Nonlinear Distortion and Hardware Impairments," IEEE Transactions on Circuits and Systems—I: Regular Papers, vol. 60, No. 11, Nov. 2013, pp. 3055-3068.
Notice of Allowance for U.S. Appl. No. 13/249,319, mailed Nov. 9, 2012, 8 pages.
Kim, Jiwoo et al., "A Generalized Architecture for the Frequency-Selective Digital Predistortion Linearization Technique," IEEE Transactions on Microwave Theory and Techniques, vol. 61, No. 1, Jan. 2013, IEEE, pp. 596-605.
Invitation to Pay Additional Fees and Partial International Search for PCT/IB2014/061160, mailed Sep. 18, 2014, 7 pages.
Invitation to Pay Additional Fees and Partial International Search for PCT/IB2014/061161, mailed Sep. 18, 2014, 9 pages.
Non-Final Office Action for U.S. Appl. No. 13/969,858, mailed Mar. 27, 2015, 17 pages.
International Preliminary Report on Patentability for PCT/IB2014/061160, mailed Dec. 3, 2015, 11 pages.
International Preliminary Report on Patentability for PCT/IB2014/061161, mailed Dec. 3, 2015, 12 pages.
Final Office Action for U.S. Appl. No. 13/969,858, mailed Aug. 11, 2015, 8 pages.

* cited by examiner

LINEARIZATION OF INTERMODULATION BANDS FOR CONCURRENT DUAL-BAND POWER AMPLIFIERS

RELATED APPLICATIONS

This application is a Continuation-in-Part of U.S. patent application Ser. No. 13/969,858 entitled LOW COMPLEXITY DIGITAL PREDISTORTION FOR CONCURRENT MULTI-BAND TRANSMITTERS, filed Aug. 19, 2013, which claims the benefit of U.S. Provisional Patent Application Ser. No. 61/826,060, filed May 22, 2013, the disclosures of which are hereby incorporated herein by reference in their entireties.

FIELD OF THE DISCLOSURE

The present disclosure relates to digital predistortion for a concurrent multi-band transmitter.

BACKGROUND

In many modern applications, there is a desire for concurrent multi-band transmitters that are capable of transmitting concurrent multi-band signals. As used herein, a concurrent multi-band signal is a signal that occupies multiple distinct frequency bands. More specifically, a concurrent multi-band signal contains frequency components occupying a different continuous bandwidth for each of multiple frequency bands. The concurrent multi-band signal contains no frequency components between adjacent frequency bands. One example of a concurrent multi-band signal is a concurrent dual-band signal. One exemplary application for concurrent multi-band signals that is of particular interest is a multi-standard cellular communications system. A base station in a multi-standard cellular communications system may be required to simultaneously, or concurrently, transmit multiple signals for multiple different cellular communications protocols or standards (i.e., transmit a multi-band signal). Similarly, in some scenarios, a base station in a Long Term Evolution (LTE) cellular communications protocol may be required to simultaneously transmit signals in separate frequency bands.

A concurrent multi-band transmitter includes a multi-band power amplifier that operates to amplify a concurrent multi-band signal to be transmitted to a desired power level. Like their single-band counterparts, multi-band power amplifiers are configured to achieve maximum efficiency, which results in poor linearity. For single-band transmitters, digital predistortion of a digital input signal of the single-band transmitter is typically used to predistort the digital input signal using an inverse model of the nonlinearity of the power amplifier to thereby compensate, or counter-act, the nonlinearity of the power amplifier. By doing so, an overall response of the single-band transmitter is linearized.

One issue with concurrent multi-band transmitters is that conventional single-band digital predistortion techniques cannot be used. Specifically, as an example, a concurrent dual-band transmitter exhibits three types of intermodulation products at the output of the concurrent dual-band transmitter, as illustrated in FIG. 1. The first type of intermodulation products consist of in-band intermodulation products around each carrier frequency ($\omega_1$ and $\omega_2$) that are solely due to the intermodulation between signal elements within each band, which is similar to what is found in a single-band transmitter and is referred to as in-band intermodulation. The second type of intermodulation products consist of intermodulation products that appear in the same frequency range as the in-band intermodulation but are the result of intermodulation products between signal elements in both frequency bands (i.e., both the frequency band centered at $\omega_1$ and the frequency band centered at $\omega_2$). This second type of intermodulation products is referred to as cross-modulation. Lastly, the third type of intermodulation products consist of intermodulation products between the two signals in both frequency bands that are located at $\Delta\omega$ away from the lower and upper carrier frequencies. This third type of intermodulation products is referred to as out-of-band intermodulation and may contain, for example, third-order intermodulation distortion.

Typically, the out-of-band intermodulation can be removed via filtering at the output of the power amplifier and, as such, can be ignored. However, the issue with the concurrent dual-band transmitter is that conventional single-band digital predistortion techniques cannot practically be used to compensate for both in-band intermodulation and cross-modulation. Specifically, treating the digital input signals of the concurrent dual-band transmitter as a single-band digital input signal and using a single digital predistorter to compensate for both in-band intermodulation and cross-modulation requires observing a bandwidth at the output of the concurrent dual-band transmitter that is extremely wide. As a result, a required sampling rate for Analog-to-Digital (A/D) conversion and the digital circuitry is too high for a practical implementation. Conversely, using two separate signal-band predistorters to independently compensate for distortion in each frequency band is insufficient because this approach does not compensate for cross-modulation.

In order to address these issues, a Dual-Band Digital Predistortion technique (referred to as 2D-DPD) was proposed in Seyed Aidin Bassam et al., "2-D Digital Predistortion (2-D-DPD) Architecture for Concurrent Dual-Band Transmitters," IEEE Transactions on Microwave Theory and Techniques, Vol. 59, No. 10, October 2011, pp. 2547-2553. The 2D-DPD technique relies on separate predistorters and separate adaptors for each band. In particular, the 2D-DPD technique uses the following baseband model for the separate predistorters:

$$y_1(n) = \sum_{m=0}^{M-1} \sum_{k=0}^{N-1} \sum_{j=0}^{k} c_{k,j,m}^{(1)} x_1(n-m)|x_1(n-m)|^{k-j} |x_2(n-m)|^j \quad (1)$$

$$y_2(n) = \sum_{m=0}^{M-1} \sum_{k=0}^{N-1} \sum_{j=0}^{k} c_{k,j,m}^{(2)} x_2(n-m)|x_2(n-m)|^{k-j} |x_1(n-m)|^j \quad (2)$$

where $y_i(n)$ is the predistorted output signal of the digital predistorter for band i (i=1, 2 for the concurrent dual-band transmitter), M represents a memory depth of the 2D-DPD baseband model, N is the nonlinear order of the 2D-DPD baseband model (i.e., an order of nonlinearity compensated for by the digital predistorters), $c_{k,j,m}^{(i)}$ are complex valued predistortion coefficients for the digital predistorter for band i that are configured by a corresponding adaptor for band i, $x_1$ is the digital input signal for the first band, and $x_2$ is the digital input signal for the second band.

One issue with the 2D-DPD technique is that the 2D-DPD baseband model of Equations (1) and (2) requires a large number of predistortion coefficients $c_{k,j,m}^{(i)}$ to be adaptively configured by the corresponding adaptors. Specifically, since there are three summations, the number of predistortion coefficients $c_{k,j,m}^{(i)}$ required by the 2D-DPD baseband model is M(K+1)(K+2) The large number of predistortion coefficients results in a high complexity, and thus high cost, DPD architecture.

In You-Jiang Liu et al., "Digital Predistortion for Concurrent Dual-Band Transmitters Using 2-D Modified Memory Polynomials," IEEE Transactions on Microwave Theory and Techniques, Vol. 61, No. 1, January 2013, pp. 281-290 and You-Jiang Liu et al., "Low-complexity 2D behavioural model for concurrent dual-band power amplifiers," Electronic Letters, Vol. 48, No. 11, May 24, 2012, a Dual-Band Modified Memory Polynomial (2D-MMP) baseband model was proposed that reduces the number of predistortion coefficients. Like the 2D-DPD baseband model, the 2D-MMP baseband model relies on separate predisters and separate adaptors for each frequency band. In particular, the 2D-MMP baseband model is defined as:

$$y_1(n) = \sum_{m=0}^{M-1} \sum_{k=0}^{N-1} c_{k,m}^{(1)} x_1(n-m) \| x_1(n-m) + jb_{k+1}^{(1)} |x_2(n-m)| \|^k \quad (3)$$

$$y_2(n) = \sum_{m=0}^{M-1} \sum_{k=0}^{N-1} c_{k,m}^{(2)} x_2(n-m) \| x_2(n-m) + jb_{k+1}^{(2)} |x_1(n-m)| \|^k \quad (4)$$

where $b_{k+1}^{(i)}$ are pre-calculated (k+1)-th order envelope coupling factors between $x_1$ and $x_2$.

While the 2D-MMP baseband model results in a reduction in the number of predistortion coefficients, a baseband model for dual-band, or more generally multi-band, digital predistortion having a further reduction in the number of predistortion coefficients and thus complexity is desired.

Still further, in Lei Ding et al., "Concurrent Dual-band Digital Predistortion," 2012 IEEE MTT-S International Microwave Symposium Digest, Jun. 17-22, 2012, pp. 1-3, an in-band predistorter for concurrent dual-band transmitters that is based on Look-Up Tables (LUTs) is disclosed. The proposed baseband model is defined as:

$$y^{(1)}(n) = \sum_{m=0}^{M-1} x_1(n-m) \quad (5)$$

$$\{LUT_{1m}[|x_1(n-m)|^2] + LUT_{2m}[|x_1(n-m)|^2 + |x_2(n-m)|^2]\}$$

$$y^{(2)}(n) = \sum_{m=0}^{M-1} x_2(n-m) \quad (6)$$

$$\{LUT_{1m}[|x_2(n-m)|^2] + LUT_{2m}[|x_2(n-m)|^2 + |x_1(n-m)|^2]\}$$

where $$LUT_m[|x(n-m)|^2] = \sum_{k=0}^{K-1} a_{2k+1,m} |x(n-m)|^{2k} \quad (7)$$

and where $a_{2k+1,m}$ are the predistortion coefficients. Note that this technique also requires one predistorter and one adaptor per band.

While the out-of-band intermodulation can typically be removed via filtering at the output of the power amplifier, this is not always the case. Depending on the frequency separation between the frequency bands of the concurrent multi-band signal, there are situations where the out-of-band intermodulation products fall close to the desired frequency bands of the concurrent multi-band signal. In this case, it is challenging, costly, or simply impossible from a system perspective to filter these out-of-band intermodulation products via an analog filter.

As such, there is a need for a system for linearizing in-band as well as the out-of-band intermodulation products of concurrent multi-band (e.g., concurrent dual-band) power amplifiers particularly for situations where the out-of-band intermodulation products cannot be removed, or are difficult to remove, by analog filters.

SUMMARY

The present disclosure relates to digital predistortion for a concurrent multi-band transmitter that compensates for both in-band and out-of-band intermodulation products according to a memory polynomial based baseband model. In one embodiment, a concurrent multi-band transmitter includes a digital predistortion subsystem, power amplifier circuitry, and an adaptation subsystem. The digital predistortion subsystem includes multiple digital predistorters configured to process digital input signals for frequency bands of a concurrent multi-band signal to provide predistorted digital input signals each being for a different one of the frequency bands of the concurrent multi-band signal and one or more intermodulation distortion compensation signals each being for a different one of one or more intermodulation distortion frequency bands. The concurrent multi-band transmitter also includes circuitry configured to process the predistorted digital input signals and the one or more intermodulation distortion compensation signals to provide a predistorted concurrent multi-band signal. The power amplifier circuitry is configured to amplify the predistorted concurrent multi-band signal to provide the concurrent multi-band signal. The adaptation subsystem is configured to adaptively configure the plurality of digital predistorters according to a memory polynomial based digital baseband model of the digital predistorters.

In one embodiment, the digital predistorters include a first set of digital predistorters that includes a separate digital predistorter for each frequency band of the concurrent multi-band signal and a second set of digital predistorters that includes a separate digital predistorter for each intermodulation distortion frequency band of the one or more intermodulation distortion frequency bands. The first set of digital predistorters are configured to process the input signals to provide the predistorted digital input signals, and the second set of digital predistorters are configured to process the input signals to provide the one or more intermodulation distortion compensation signals. In one embodiment, one or more intermodulation distortion compensation signals are multiple intermodulation distortion compensation signals for multiple intermodulation distortion frequency bands. In one embodiment, the adaptation subsystem includes two or more adaptors, where the number of adaptors is less than the number of digital predistorters. In another embodiment, the adaptation subsystem includes a single adaptor configured to adaptively configure all of the digital predistorters.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 4:
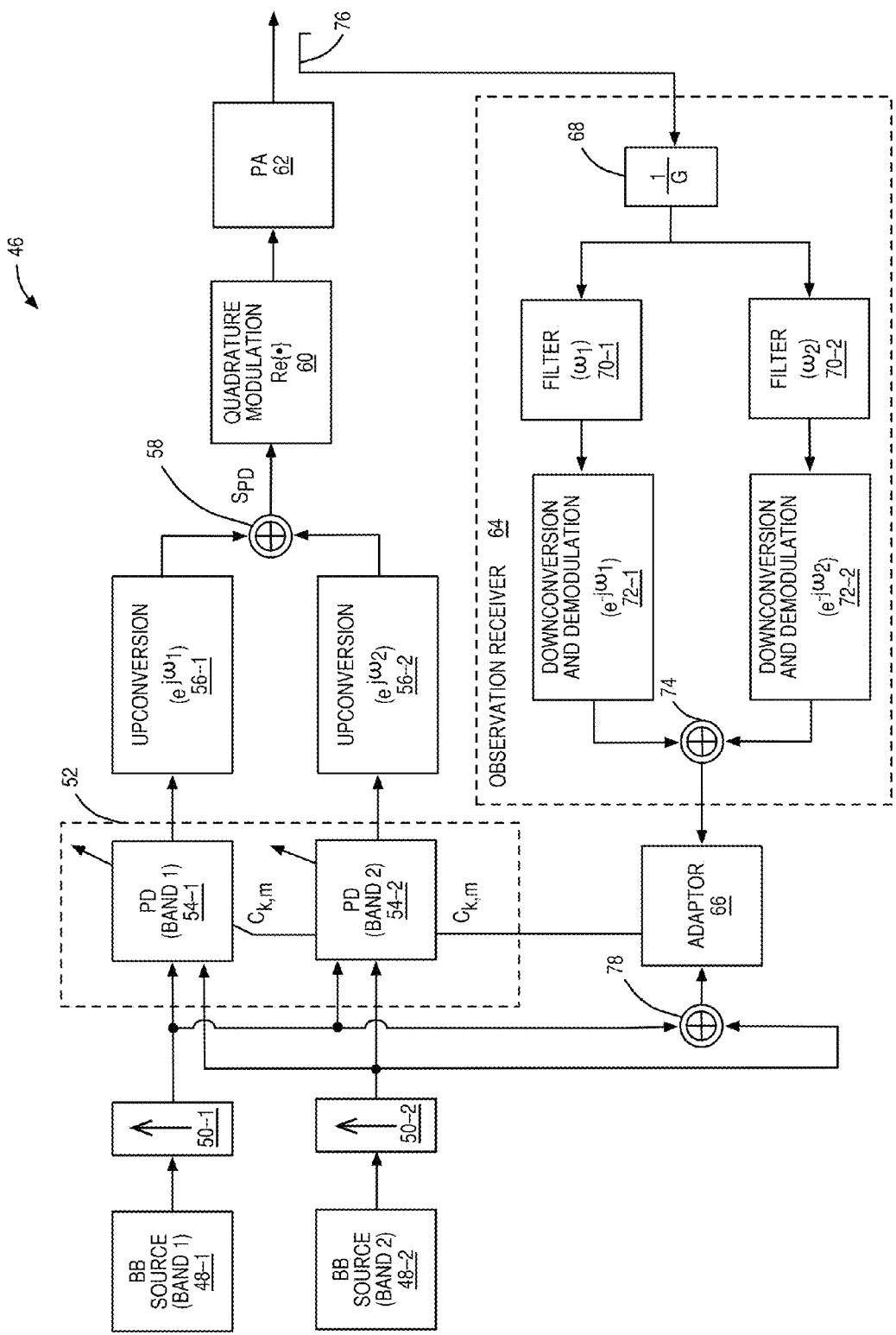
Figure 5:
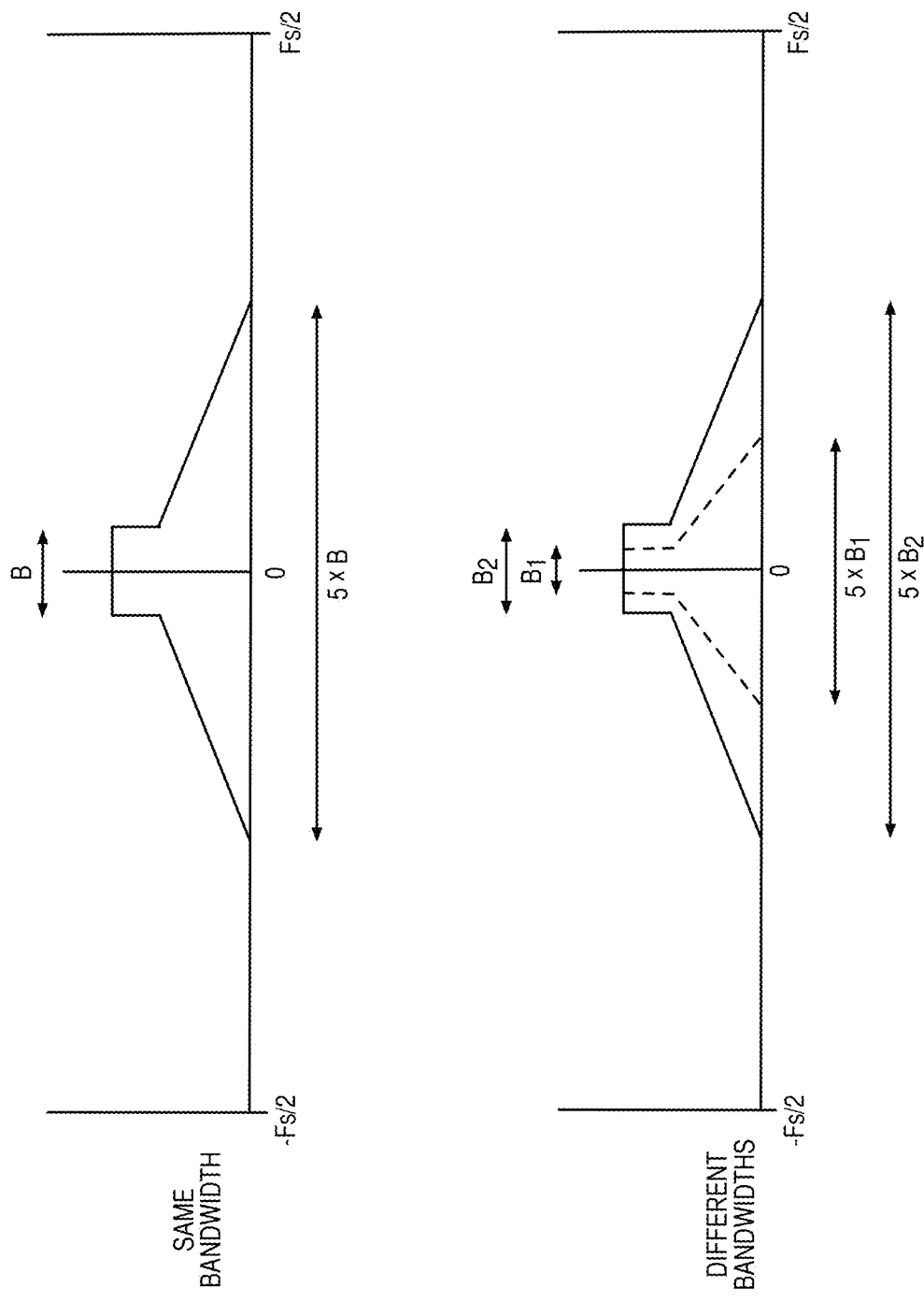
Figure 6:
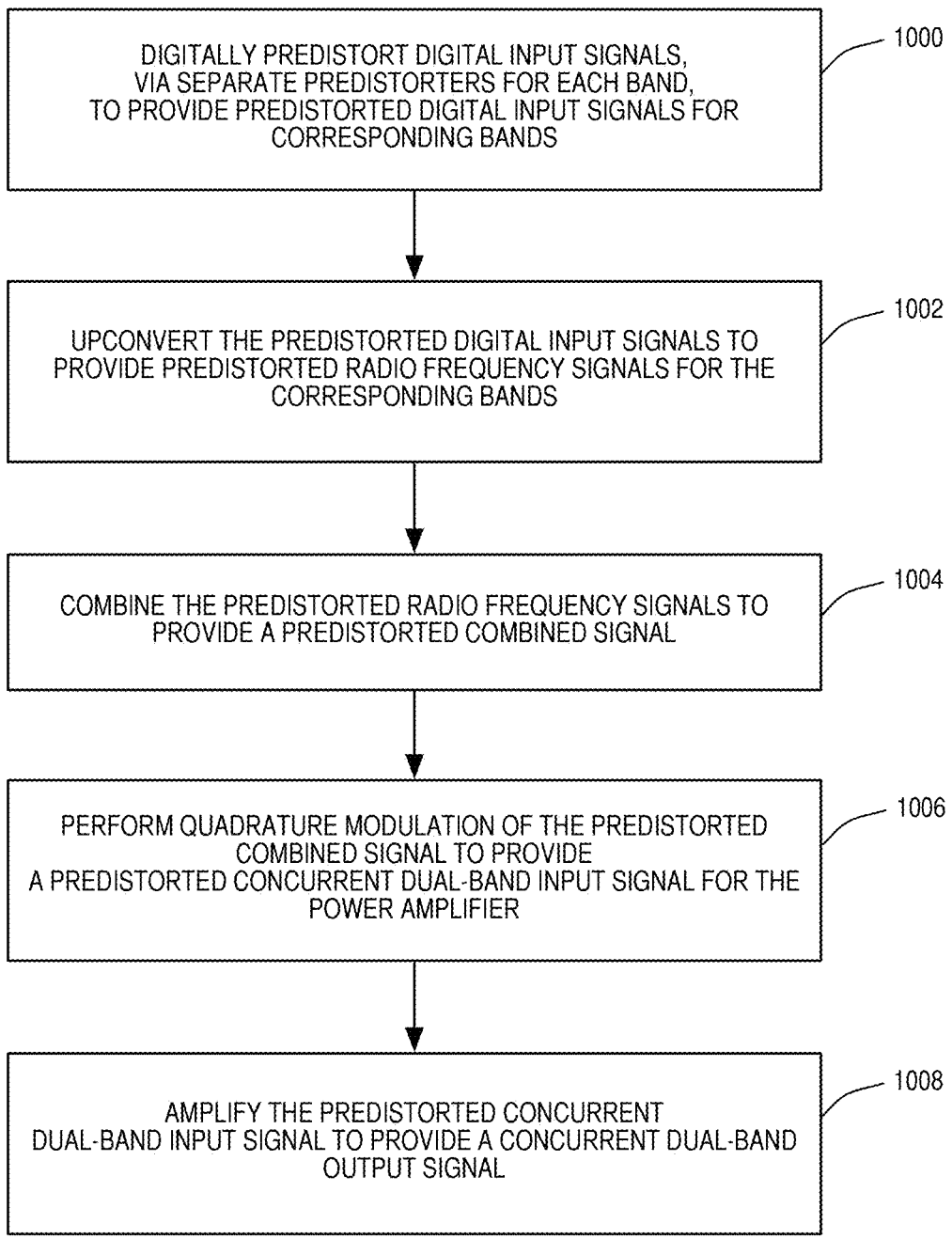
Figure 7:
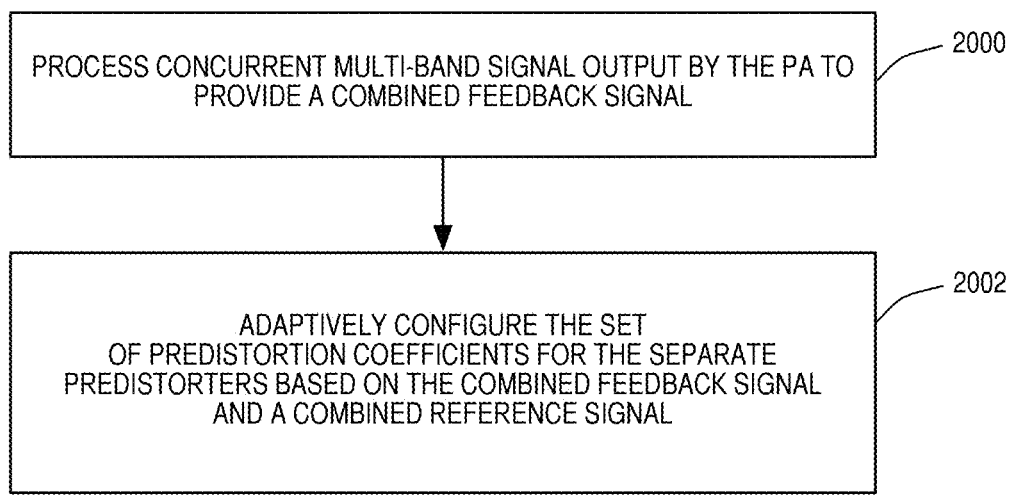
Figure 8:
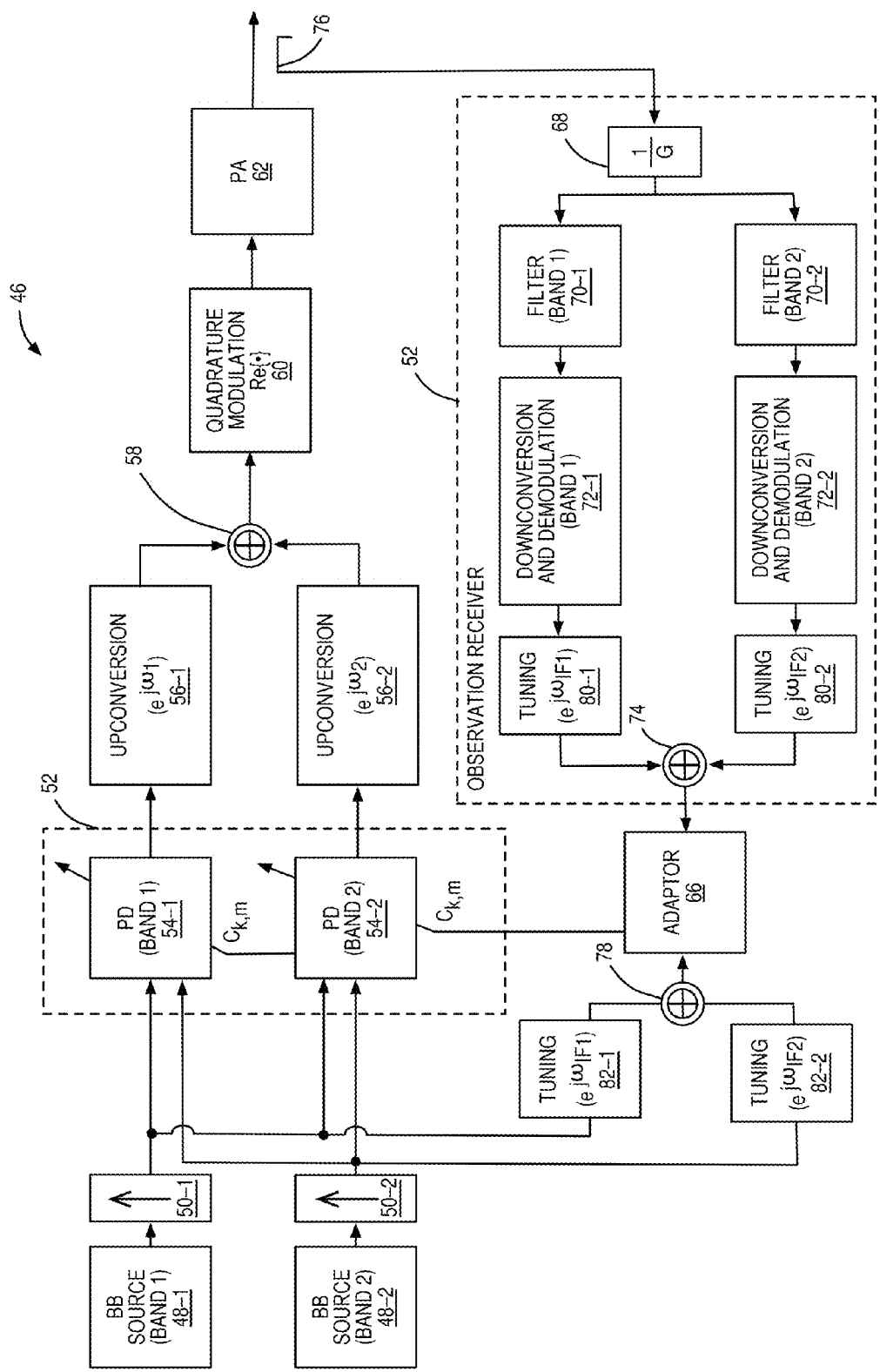
Figure 9:
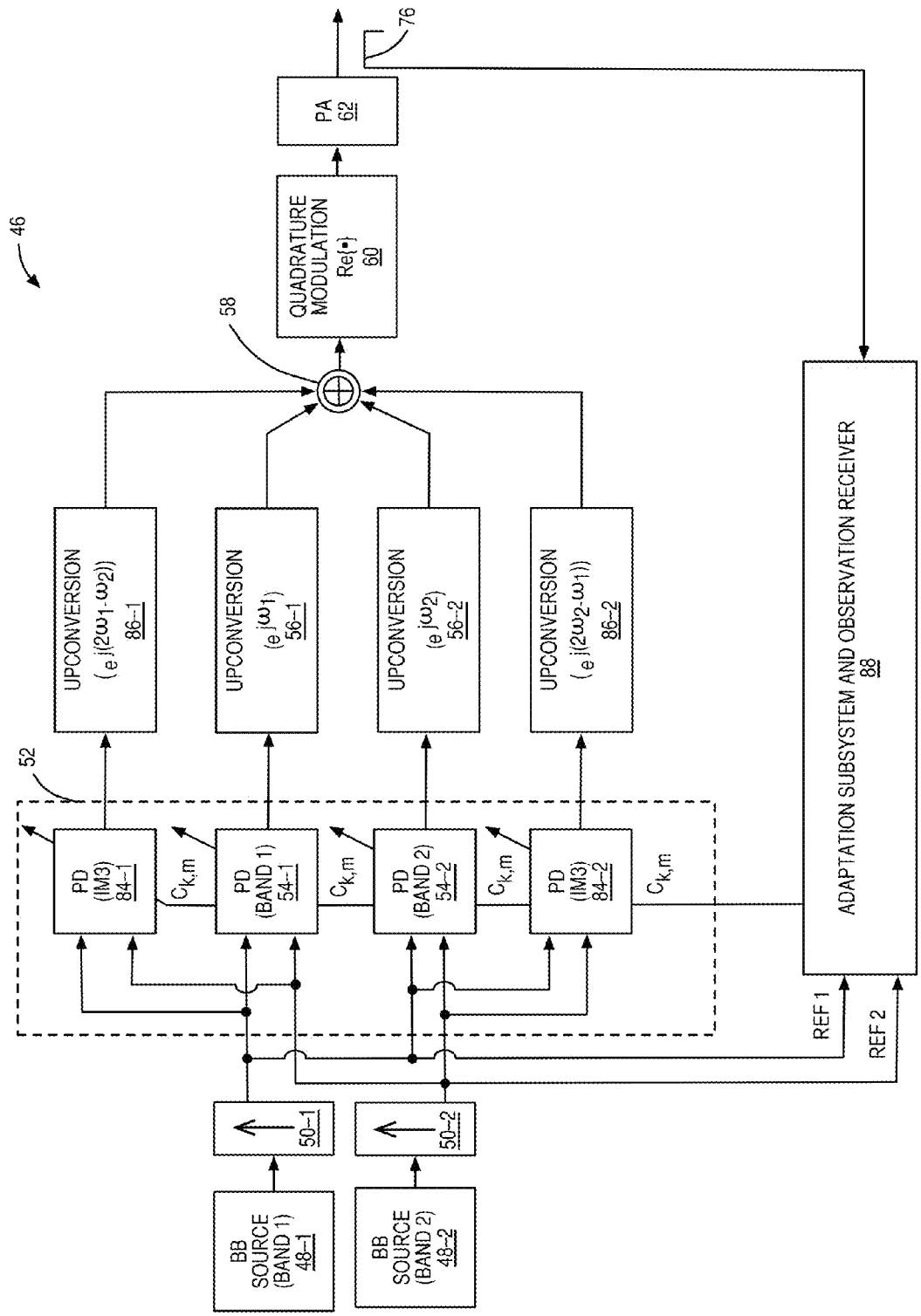
Figure 10:
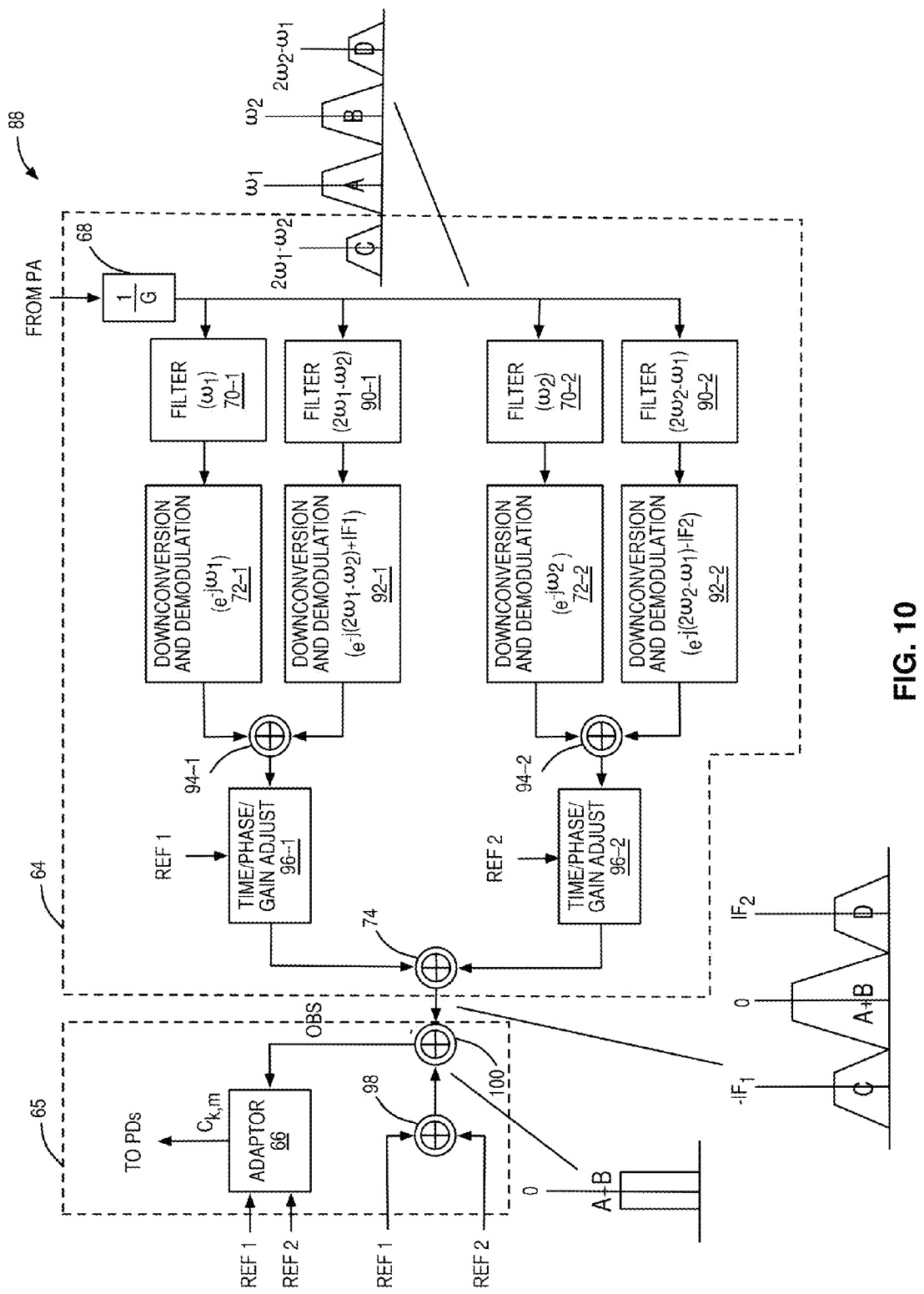
Figure 11:
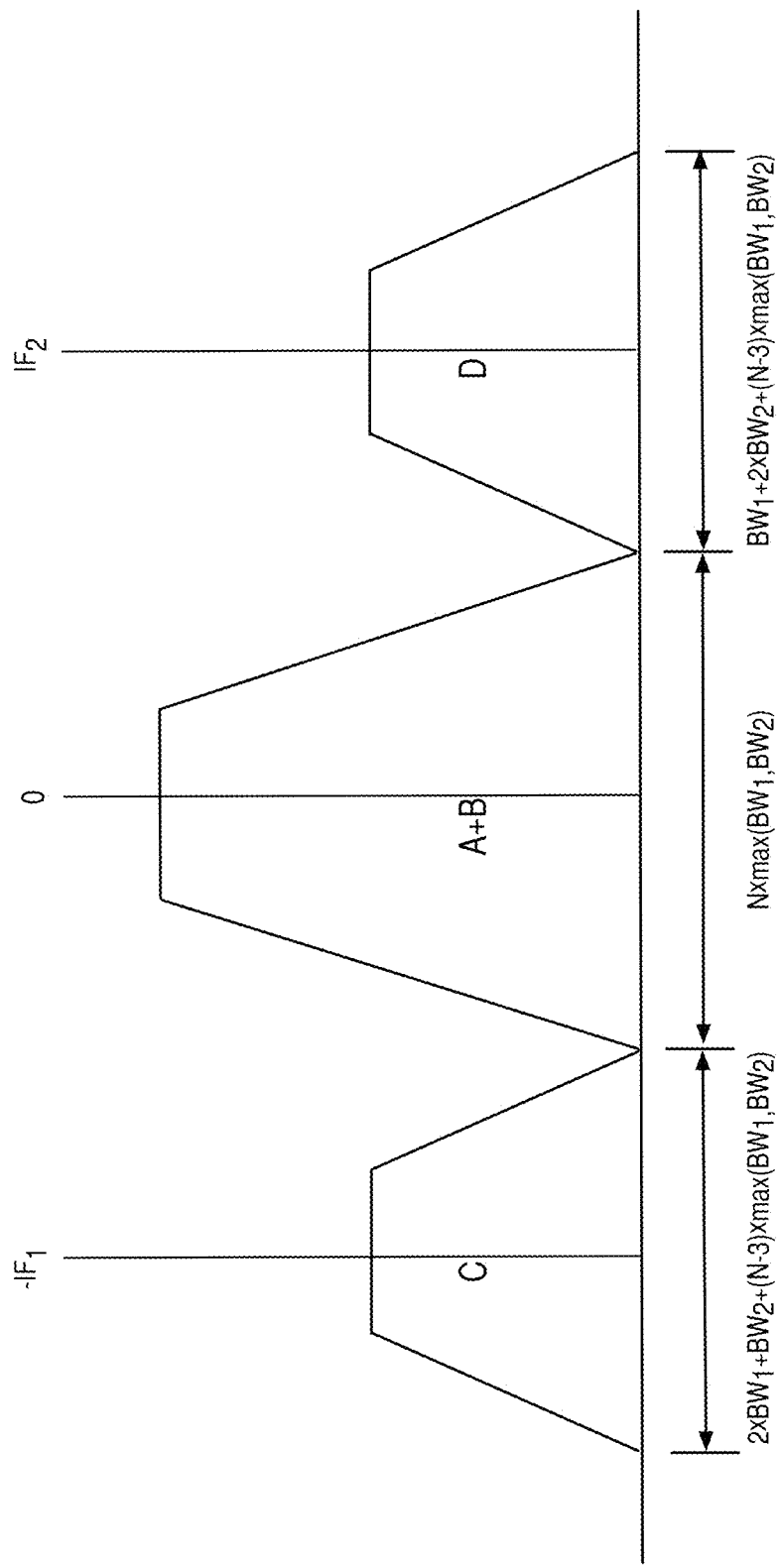
Figure 12:
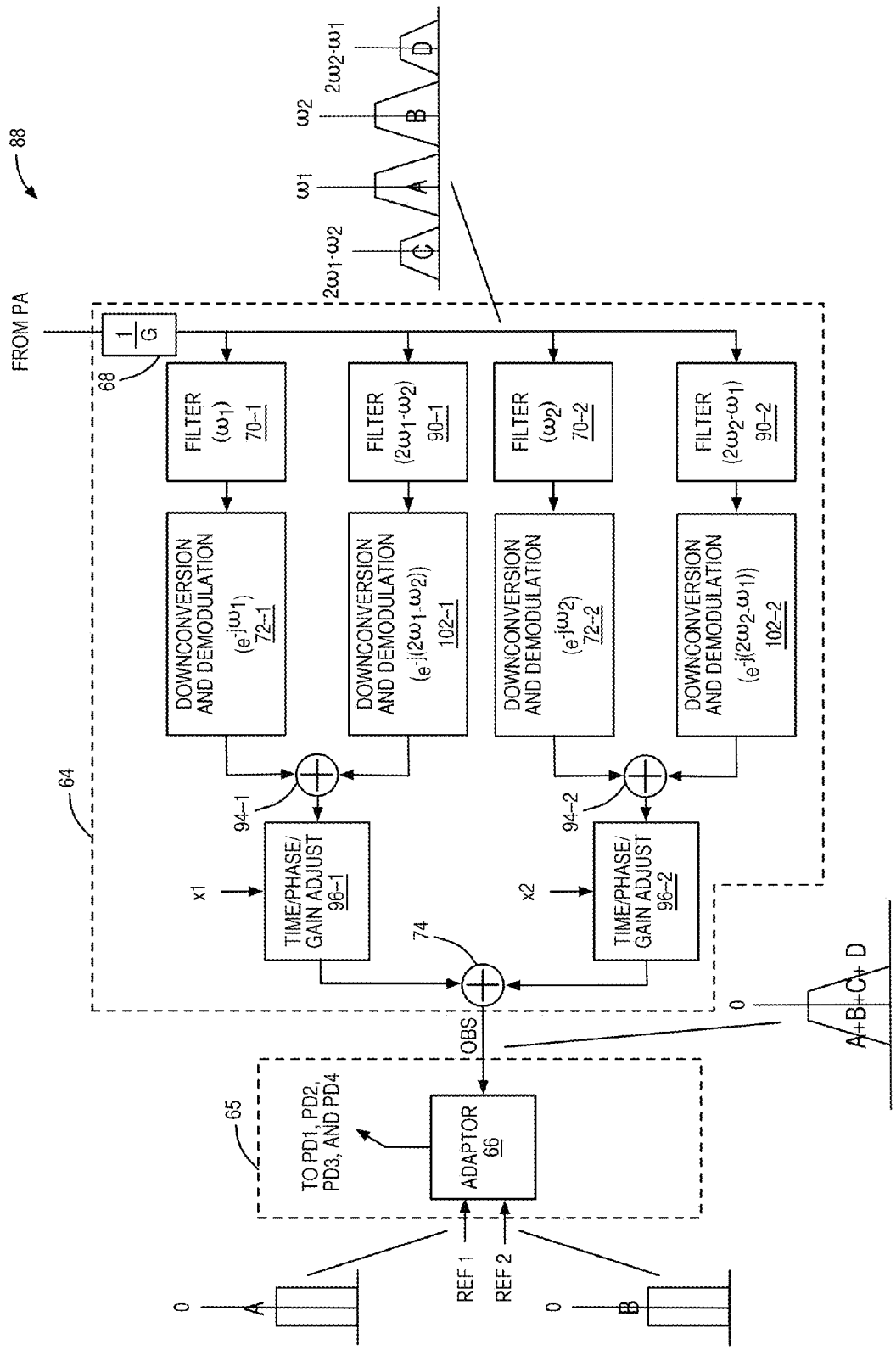
Figure 13:
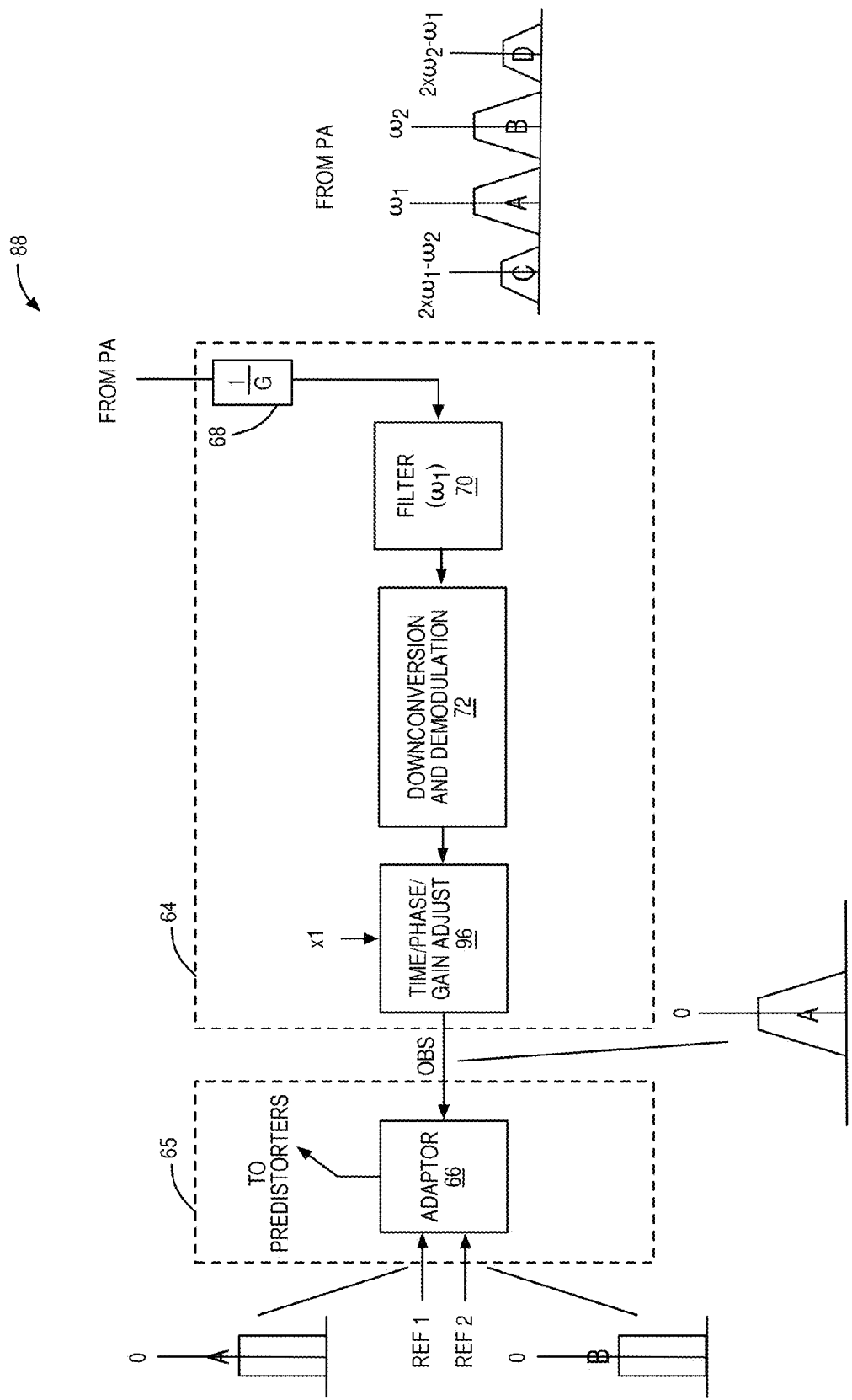
Figure 14:
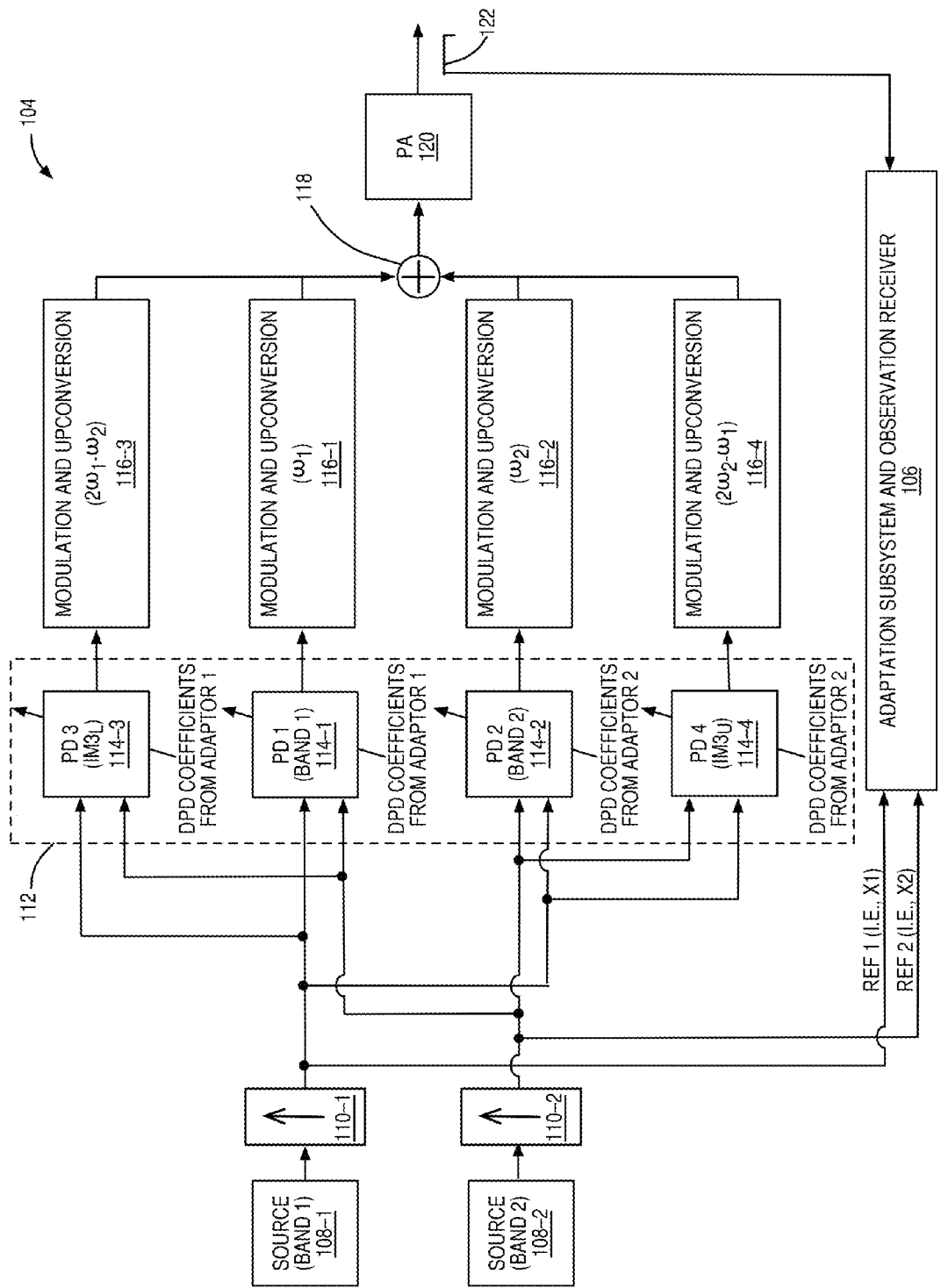
Figure 15:
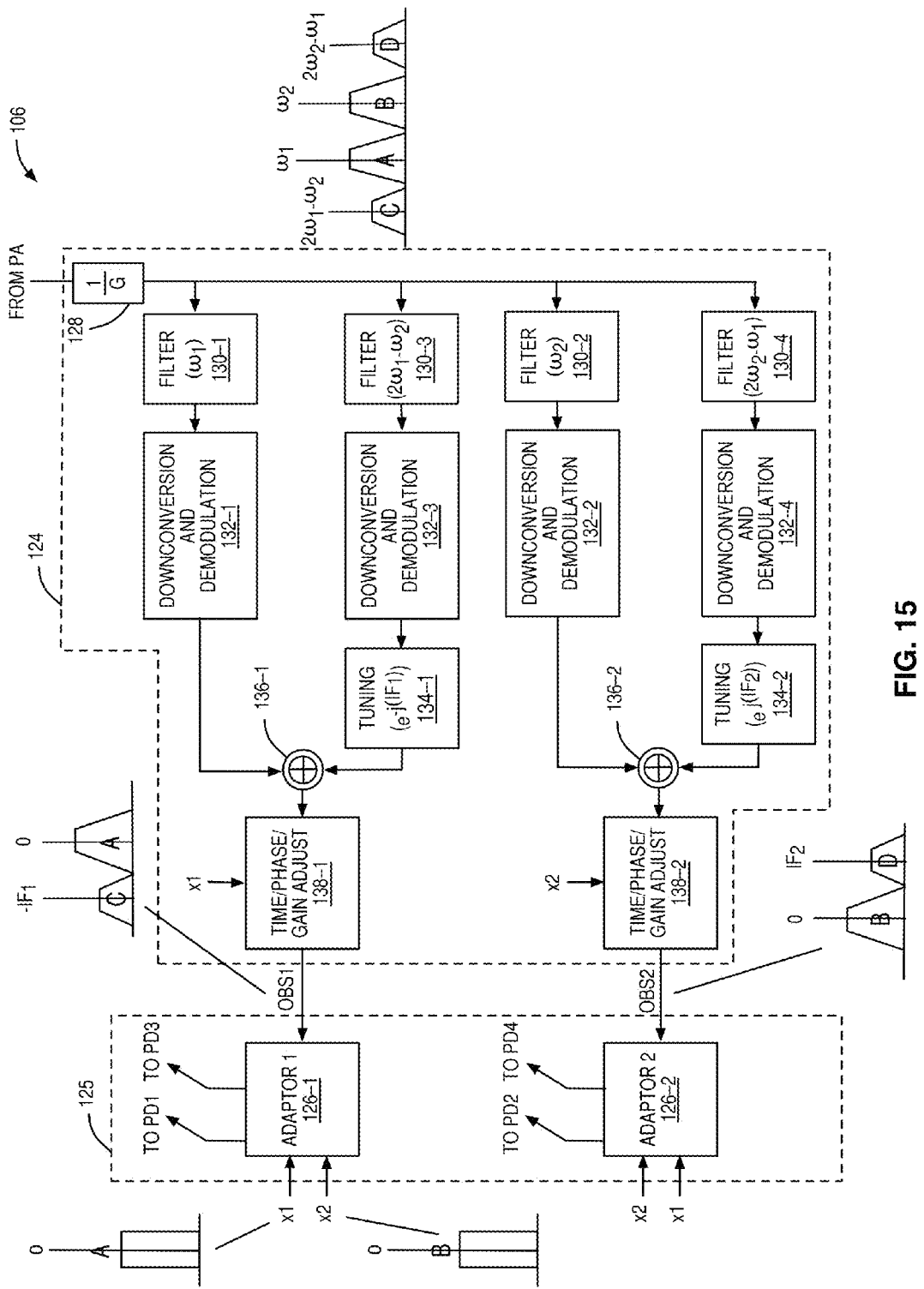

FIG. 4 illustrates a concurrent dual-band transmitter having separate digital predistorters for each band along with a single adaptor that adaptively configures each of the digital predistorters using a same set of predistortion coefficients based on a dual-band memory polynomial baseband model of the digital predistorters that utilizes the same set of predistortion coefficients for each of the digital predistorters according to one embodiment of the present disclosure;

FIG. 5 is a frequency band diagram of a combined observation signal utilized by the adaptor of FIG. 4 according to one embodiment of the present disclosure;

FIG. 6 is a flow chart that illustrates the operation of the transmit chain of the dual-band transmitter of FIG. 4 according to one embodiment of the present disclosure;

FIG. 7 is a flow chart that illustrates the operation of the observation receiver and the adaptor of FIG. 6 according to one embodiment of the present disclosure;

FIG. 8 illustrates the concurrent dual-band transmitter according to another embodiment of the present disclosure;

FIG. 9 illustrates another embodiment of the concurrent dual-band transmitter that also compensates for Third-Order Intermodulation (IM3) according to another embodiment of the present disclosure;

FIG. 10 illustrates one embodiment of the adaptation subsystem of FIG. 9;

FIG. 11 is a frequency band diagram that illustrates the frequency bands of the combined feedback signal utilized by the adaptor of FIG. 10 according to one embodiment of the present disclosure;

FIG. 12 illustrates another embodiment of the adaptation subsystem of FIG. 9;

FIG. 13 illustrates yet another embodiment of the adaptation subsystem of FIG. 9;

FIG. 14 illustrates a concurrent dual-band transmitter that compensates for both in-band and out-of-band intermodulation distortion according to another embodiment of the present disclosure;

FIG. 15 illustrates one embodiment of the adaptation subsystem of FIG. 14; and

Figure 16:
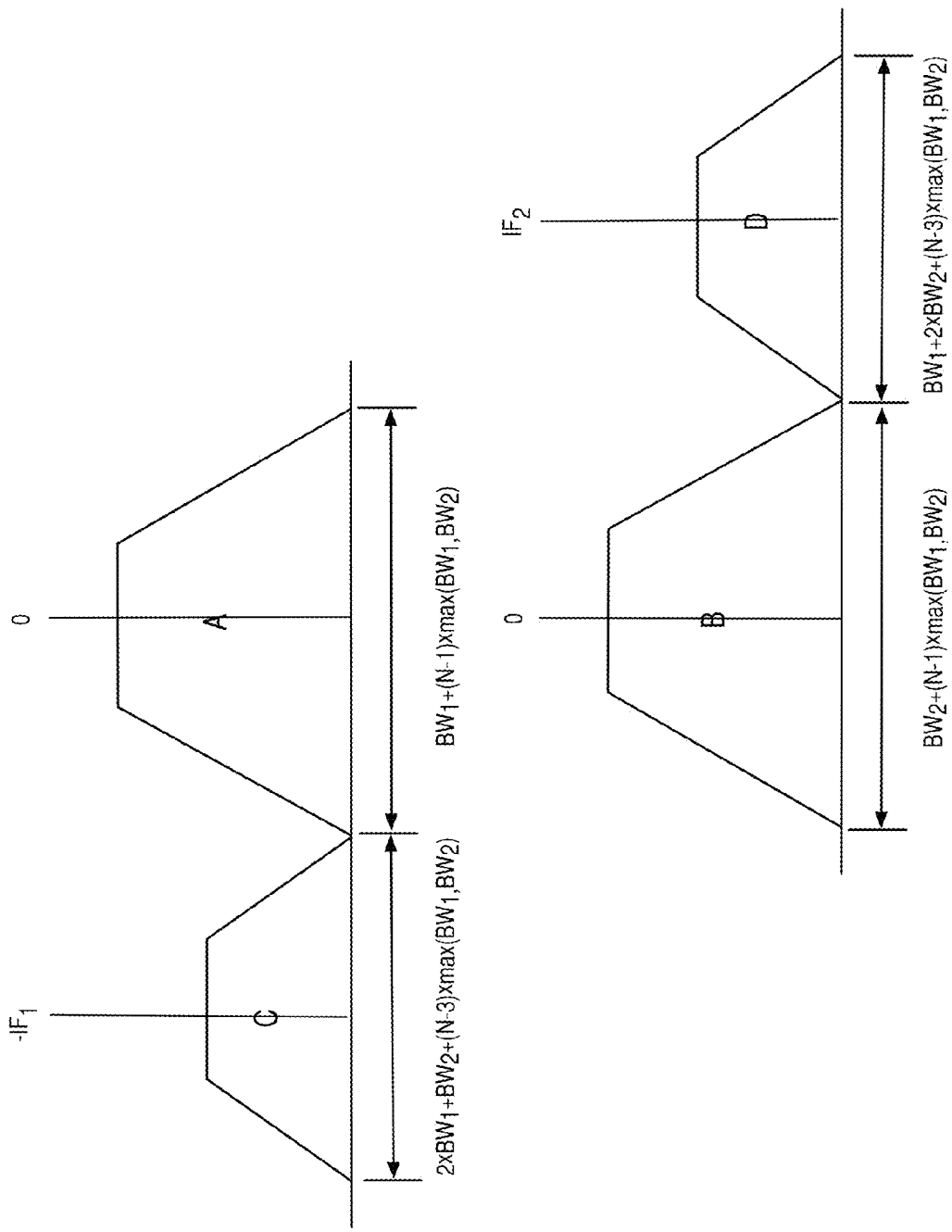

FIG. 16 is a frequency band diagram that illustrates selection of intermediate frequencies for the IM3 frequency bands such that the frequency bands of the combined feedback signals utilized by the adaptors of FIG. 15 to not overlap while total bandwidths of the combined feedback signals are minimized according to one embodiment of the present disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
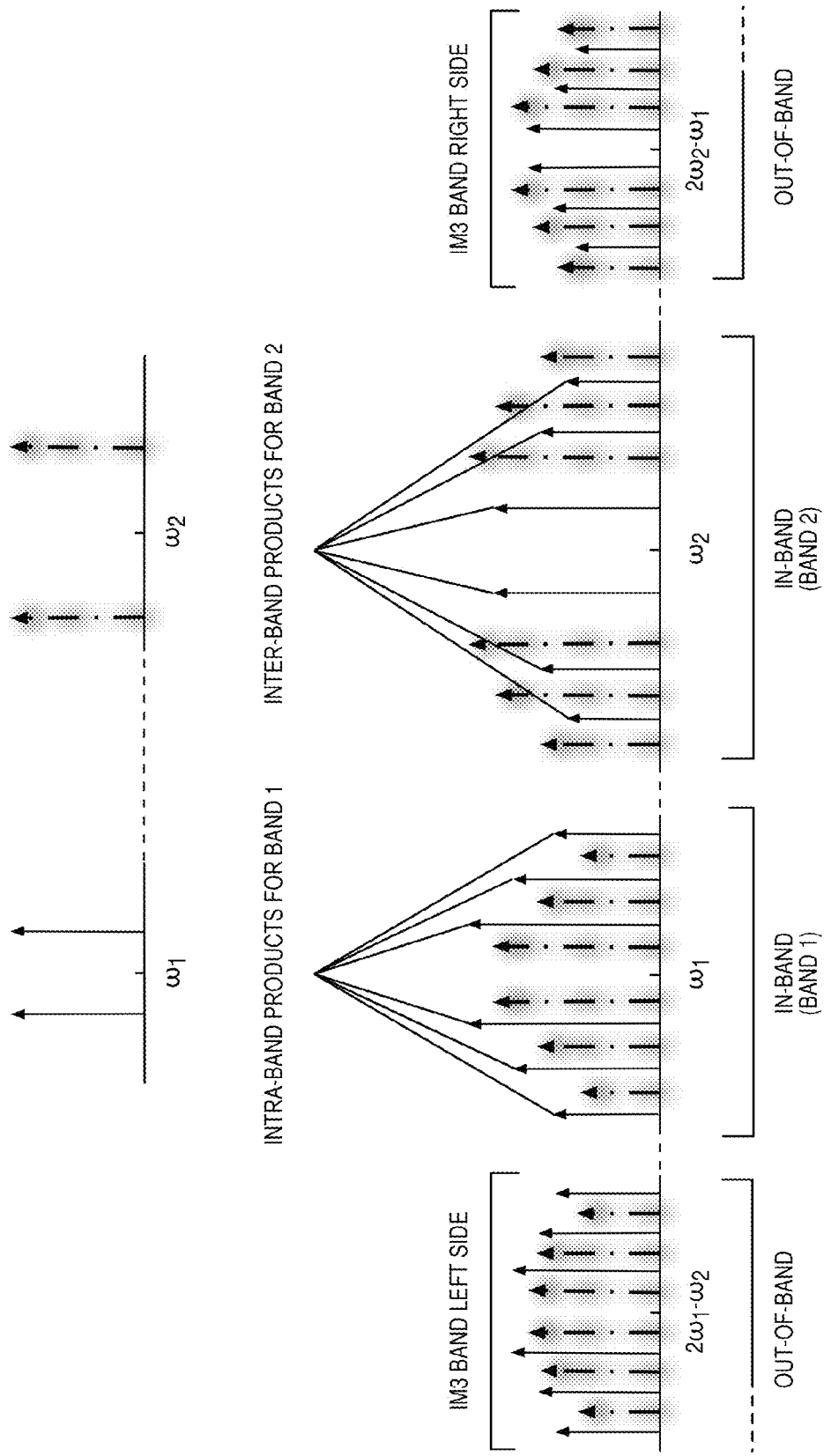
FIG. 1 illustrates intermodulation and cross modulation products in a concurrent dual-band transmitter.
Figure 2:
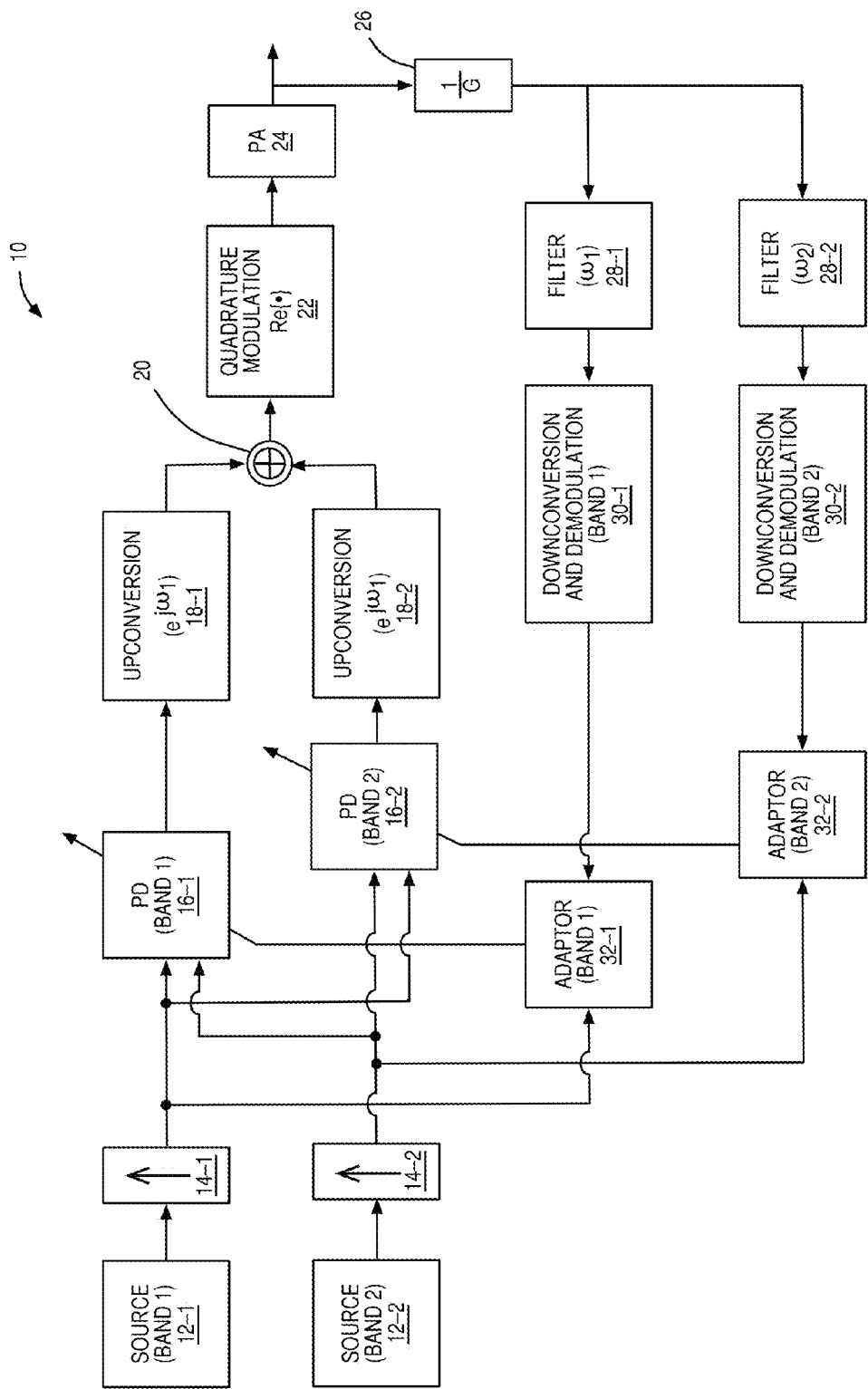
FIG. 2 illustrates a concurrent dual-band transmitter that performs dual-band digital predistortion using a conventional Dual-Band Digital Predistortion (2D-DPD) baseband model.

Embodiments of the present disclosure relate to digital predistortion for a concurrent multi-band transmitter that utilizes a single adaptor and a same set of predistortion coefficients to configure separate digital predistorters for each band. Before discussing embodiments of the present disclosure, a discussion of a concurrent dual-band transmitter 10 that utilizes a conventional dual-band predistortion baseband model as illustrated in FIG. 2 is beneficial. The concurrent dual-band transmitter 10 includes baseband sources 12-1 and 12-2 (e.g., modem(s)) of digital input signals for the concurrent dual-band transmitter 10, up-sampling circuitry 14-1 and 14-2, digital predistorters 16-1 and 16-2, upconversion circuitry 18-1 and 18-2, combining circuitry 20, quadrature modulation circuitry 22, and power amplifier circuitry 24 connected as shown.

The baseband source 12-1 provides a digital baseband input signal for a first frequency band of a concurrent dual-band signal to be transmitted by the concurrent dual-band transmitter 10, and the baseband source 12-2 provides a digital baseband input signal for a second frequency band of the concurrent dual-band signal to be transmitted by the concurrent dual-band transmitter 10. The up-sampling circuitries 14-1 and 14-2 up-sample the digital baseband input signals to a desired sampling rate. The digital predistorter 16-1 processes the up-sampled digital baseband input signals to provide a first predistorted input signal for the first frequency band of the concurrent multi-band signal, and the digital predistorter 16-2 processes the up-sampled digital baseband input signals to provide a second predistorted input signal for the second frequency band of the concurrent multi-band signal.

The digital predistorters 16-1 and 16-2 provide the predistorted input signals according to a conventional baseband model, i.e., either the Dual-Band Digital Predistortion (2D-DPD) baseband model of Equations (1) and (2) or the conventional Dual-Band Modified Memory Polynomial (2D-MMP) baseband model of Equations (3) and (4). According to the conventional baseband model, the digital predistorter 16-1 is configured by a first set of complex valued predistortion coefficients, i.e., $c_{k,j,m}^{(1)}$ of Equation (1) or $c_{k,j,m}^{(1)}$ of Equation (3), and the digital predistorter 16-2 is configured by a second set of complex valued predistortion coefficients, i.e., $c_{k,j,m}^{(1)}$ of Equation (2) or $c_{k,j,m}^{(2)}$ of Equation (4).

The upconversion circuitry 18-1 up-converts the predistorted input signal output by the digital predistorter 16-1 to a desired carrier frequency $\omega_1$ for the first frequency band of the concurrent dual-band signal. Likewise, the upconversion circuitry 18-2 up-converts the predistorted input signal output by the digital predistorter 16-2 to a desired carrier frequency $\omega_2$ for the second frequency band of the concurrent dual-band signal. The up-converted signals are then combined by the combining circuitry 20 and modulated by the quadrature modulation circuitry 22 to provide a predistorted concurrent dual-band input signal for the power amplifier circuitry 24. The power amplifier circuitry 24 amplifies the concurrent dual-band input signal to provide the concurrent dual-band signal to be transmitted by the concurrent dual-band transmitter 10. While not illustrated, the concurrent dual-band signal is typically filtered to remove out-of-band intermodulation distortion prior to transmission.

In order to provide adaptive configuration of the digital predistorters 16-1 and 16-2, the concurrent dual-band transmitter 10 includes a feedback path that includes an attenuator 26, filters 28-1 and 28-2, downconversion and demodulation circuitry 30-1 and 30-2, and adaptors 32-1 and 32-2. The attenuator 26 has an input that is coupled to the output of the power amplifier circuitry 24 and is configured to attenuate the concurrent dual-band signal output by the power amplifier circuitry 24 by a factor G, where G corresponds to a gain of the power amplifier circuitry 24. The filters 28-1 and 28-2 have pass-bands centered at the carrier frequencies $\omega_1$ and $\omega_2$, respectively. In operation, the filter 28-1 filters the attenuated concurrent dual-band signal to provide a feedback signal for the first frequency band of the concurrent dual-band signal. Likewise, the filter 28-2 filters the attenuated concurrent dual-band signal to provide a feedback signal for the second frequency band of the concurrent dual-band signal. The downconversion and demodulation circuitry 30-1 downconverts, demodulates, and digitizes the feedback signal for the first frequency band to provide a digital baseband feedback signal for the first frequency band. Likewise, the downconversion and demodulation circuitry 30-2 downconverts, demodulates, and digitizes the feedback signal for the second frequency band to provide a digital baseband feedback signal for the second frequency band.

Using a suitable adaptation technique (e.g., a Least Mean Squares (LMS) algorithm), the adaptor 32-1 adaptively configures the first set of predistortion coefficients for the digital predistorter 16-1 as defined by either Equation (1) of the conventional 2D-DPD model or Equation (3) of the conventional 2D-MMP model based on the up-sampled digital baseband input signal for the first frequency band and the digital baseband feedback signal for the first frequency band. In a similar manner, the adaptor 32-2 adaptively configures the second set of predistortion coefficients for the digital predistorter 16-2 as defined by either Equation (2) of the conventional 2D-DPD model or Equation (4) of the conventional 2D-MMP model based on the up-sampled digital baseband input signal for the second frequency band and the digital baseband feedback signal for the second frequency band.

Figure 3:
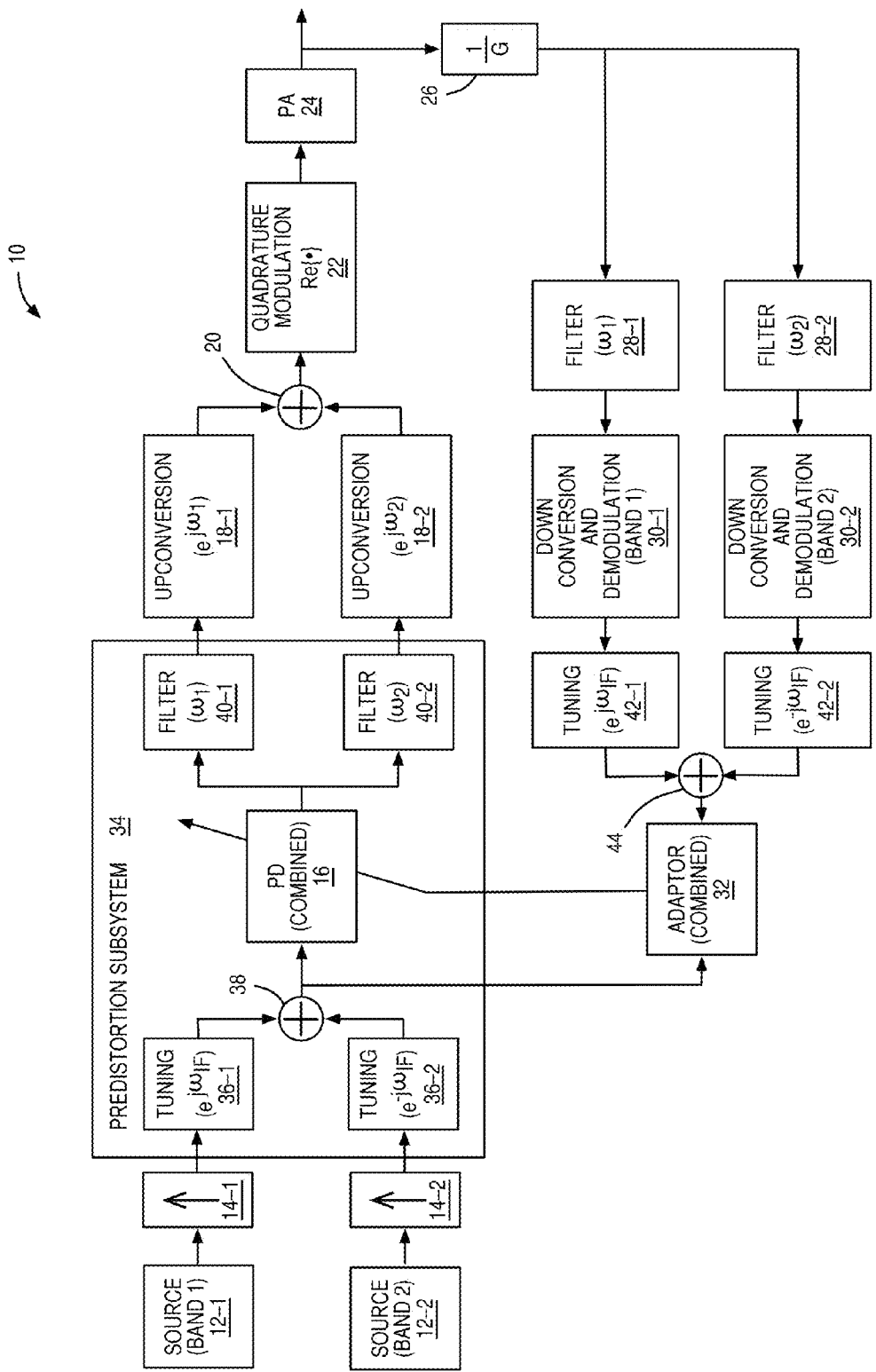
FIG. 3 illustrates a concurrent dual-band transmitter that performs dual-band digital predistortion using a known combined predistortion approach.

FIG. 3 illustrates another implementation of the concurrent dual-band transmitter 10 that utilizes an in-band linearization architecture in which the two frequency bands are tuned to different intermediate frequencies, combined, and then predistorted by a single combined digital predistorter 16 that is modeled by a memory polynomial baseband model. Specifically, as illustrated, the concurrent dual-band transmitter 10 includes the baseband sources 12-1 and 12-2 (e.g., modem(s)) of the digital input signals for the concurrent dual-band transmitter 10, the up-sampling circuitry 14-1 and 14-2, a predistortion subsystem 34 including the combined digital predistorter 16, the upconversion circuitry 18-1 and 18-2, the combining circuitry 20, the quadrature modulation circuitry 22, and the power amplifier circuitry 24 connected as shown. The predistortion subsystem 34 includes tuning circuits 36-1 and 36-2, combining circuitry 38, the combined digital predistorter 16, and filters 40-1 and 40-2 connected as shown.

The baseband source 12-1 provides the digital baseband input signal for the first frequency band of the concurrent dual-band signal to be transmitted by the concurrent dual-band transmitter 10, and the baseband source 12-2 provides the digital baseband input signal for the second frequency band of the concurrent dual-band signal to be transmitted by the concurrent dual-band transmitter 10. The up-sampling circuitries 14-1 and 14-2 up-sample the digital baseband input signals to the desired sampling rate. The tuning circuitry 36-1 tunes the digital baseband input signal for the first frequency band to a first intermediate frequency ($\omega_{IF}$), and the tuning circuitry 36-2 tunes the digital baseband input signal for the second frequency band to a second intermediate frequency ($-\omega_{IF}$). The combining circuitry 38 then combines the digital intermediate frequency signals output by the tuning circuitries 36-1 and 36-2 to provide a combined digital input signal that is then predistorted by the combined digital predistorter 16 to provide a predistorted combined digital input signal. The combined digital predistorter 16 provides the predistorted combined digital input signal according to a combined memory polynomial based model. The predistorted combined digital input signal is then filtered by the filter 40-1 to provide the first predistorted input signal for the first frequency band of the concurrent multi-band signal. Likewise, the predistorted combined digital input signal is filtered by the filter 40-2 to provide the second predistorted input signal for the second frequency band of the concurrent multi-band signal.

The upconversion circuitry 18-1 up-converts the first predistorted input signal for the first frequency band to the desired carrier frequency $\omega_1$ for the first frequency band of the concurrent dual-band signal. Likewise, the upconversion circuitry 18-2 up-converts the second predistorted input signal for the second frequency band to the desired carrier frequency $\omega_2$ for the second frequency band of the concurrent dual-band signal. The up-converted signals are then combined by the combining circuitry 20 and modulated by the quadrature modulation circuitry 22 to provide the predistorted concurrent dual-band input signal for the power amplifier circuitry 24. The power amplifier circuitry 24 amplifies the concurrent dual-band input signal to provide the concurrent dual-band signal to be transmitted by the concurrent dual-band transmitter 10. While not illustrated, the concurrent dual-band signal is typically filtered to, if possible, remove out-of-band intermodulation distortion prior to transmission.

In order to provide adaptive configuration of the combined digital predistorter 16, the concurrent dual-band transmitter 10 includes a feedback path that includes the attenuator 26, the filters 28-1 and 28-2, the downconversion and demodulation circuitry 30-1 and 30-2, tuning circuitry 42-1 and 42-1, combining circuitry 44, and a combined adaptor 32. The attenuator 26 has an input that is coupled to the output of the power amplifier circuitry 24 and is configured to attenuate the concurrent dual-band signal output by the power amplifier circuitry 24 by a factor G, where G corresponds to a gain of the power amplifier circuitry 24. The filters 28-1 and 28-2 have pass-bands centered at the carrier frequencies $\omega_1$ and $\omega_2$, respectively. In operation, the filter 28-1 filters the attenuated concurrent dual-band signal to provide a feedback signal for the first frequency band of the concurrent dual-band signal. Likewise, the filter 28-2 filters the attenuated concurrent dual-band signal to provide a feedback signal for the second frequency band of the concurrent dual-band signal. The downconversion and demodulation circuitry 30-1 downconverts, demodulates, and digitizes the feedback signal for the first frequency band to provide a digital baseband feedback signal for the first frequency band. Likewise, the downconversion and demodulation circuitry 30-2 downconverts, demodulates, and digitizes the feedback signal for the second frequency band to provide a digital baseband feedback signal for the second frequency band.

The tuning circuitry 42-1 tunes the digital baseband feedback signal for the first frequency band to the appropriate intermediate frequency ($\omega_{IF}$) for the first frequency band (corresponding to the intermediate frequency of the tuning circuitry 36-1). Likewise, the tuning circuitry 42-2 tunes the digital baseband feedback signal for the second frequency band to the appropriate intermediate frequency ($-\omega_{IF}$) for the second frequency band (corresponding to the intermediate frequency of the tuning circuitry 36-2). The digital intermediate frequency feedback signals are combined by the combining circuitry 44 to provide a combined digital feedback signal. Using a suitable adaptation technique (e.g., a LMS algorithm), the combined adaptor 32 adaptively configures a set of predistortion coefficients for the combined digital predistorter 16 based on the combined digital input signal and the combined digital feedback signal.

As discussed above, the conventional 2D-DPD model requires a large number of predistortion coefficients, which in turn causes high complexity and cost for the digital predistorters 16-1 and 16-2 and the adaptors 32-1 and 32-2. The conventional 2D-MMP model reduces the number of predistortion coefficients. However, further reduction in the number of predistortion coefficients and thus the complexity and cost of the system is desired. Further, while the combined predistortion architecture of FIG. 3 reduces the number of predistortion coefficients, it has a number of issues, namely, it requires a higher sampling rate for digital-to-analog conversion and analog-to-digital conversion, it requires a higher sampling rate for digital logic (i.e., digital predistorter and adaptation), it has limited linearization performance, and it cannot be used for Third-Order Intermodulation (IM3) cancellation.

In this regard, a new baseband model for separate digital predistorters of a concurrent multi-band transmitter that utilizes a same set of predistortion coefficients for each of the digital predistorters is disclosed. Thus, the new baseband model provides the performance advantages of separate predistorters while also significantly reducing the number of predistortion coefficients and having less stringent sampling rate requirements. Specifically, for the concurrent dual-band transmitter scenario, the following nonlinear function for fifth-order distortions is assumed:

$$y(n) = c_1(n)\Re\{x(n)\} + c_3(n)\Re\{x(n)\}^3 + c_5(n)\Re\{x(n)\}^5 \quad (8)$$

where y(n) is the distorted concurrent dual-band signal, x(n) is the concurrent dual-band input signal represented by:

$$x(n) = x_1(n) \times e^{j\omega_1 nT} + x_2(n) e^{j\omega_2 nT} \quad (9)$$

where $x_1(n)$ and $x_2(n)$ represent the first and second frequency bands located around carrier frequencies $\omega_1$ and $\omega_2$, respectively, and $c_1$, $c_3$, and $c_5$ are complex coefficients. $\Re\{arg\}$ is the real part of the argument and is defined as:

$$\Re\{arg\} = \frac{(arg + arg^*)}{2} \quad (10)$$

where $(arg)^*$ is the complex conjugate operator.

By substituting Equation (9) into Equation (8) and by expanding the terms according to Equation (10), one can derive the following equation for the terms located around the carrier frequencies $\omega_1$ and $\omega_2$:

$$y(n) = c_1(x_1(n)e^{j\omega_1 nT} + x_2(n)e^{j\omega_2 nT}) + c_3 \begin{pmatrix} (x_1(n)|x_1(n)|^2 + 2x_1(n)|x_2(n)|^2)e^{j\omega_1 nT} + \\ (x_2(n)|x_2(n)|^2 + 2x_2(n)|x_1(n)|^2)e^{j\omega_2 nT} \end{pmatrix} + \quad (11)$$
$$c_5 \begin{pmatrix} (x_1(n)|x_1(n)|^4 + 6x_1(n)|x_1(n)|^2|x_2(n)|^2 + 3x_1(n)|x_2(n)|^4)e^{j\omega_1 nT} + \\ (x_2(n)|x_2(n)|^4 + 6x_2(n)|x_2(n)|^2|x_1(n)|^2 + 3x_2(n)|x_1(n)|^4)e^{j\omega_2 nT} \end{pmatrix}$$

Equation (11) can be re-written as two equations, one for each frequency band, as follows:

$$y_1(n) = \begin{pmatrix} c_1 x_1(n) + c_3 x_1(n)|x_1(n)|^2 + 2c_3 x_1(n)|x_2(n)|^2 + \\ c_5 x_1(n)|x_1(n)|^4 + 6c_5 x_1(n)|x_1(n)|^2|x_2(n)|^2 + \\ 3c_5 x_1(n)|x_2(n)|^4 \end{pmatrix} \times e^{j\omega_1 nT} \quad (12)$$

$$y_2(n) = \begin{pmatrix} c_1 x_2(n) + c_3 x_2(n)|x_2(n)|^2 + 2c_3 x_2(n)|x_1(n)|^2 + \\ c_5 x_2(n)|x_2(n)|^4 + 6c_5 x_2(n)|x_2(n)|^2|x_1(n)|^2 + \\ 3c_5 x_2(n)|x_1(n)|^4 \end{pmatrix} \times e^{j\omega_2 nT} \quad (13)$$

From Equations (11) (13), the inventors have found that the two frequency bands share the same set of coefficients and that, in this example, only three coefficients ($c_1$, $c_3$, and $c_5$) need to be calculated. The benefit of doing so is that a reduced number of predistortion coefficients are needed in the baseband model, which greatly simplifies the complexity of the digital predistortion system and that of the concurrent dual-band transmitter.

Based on this knowledge that the same set of coefficients can be used for each of the frequency bands, the inventors have developed a new digital baseband model that is based on a memory polynomial model and where the new baseband model uses the same set of predistortion coefficients for each of the frequency bands. Specifically, the new baseband model is defined as:

$$y_1(n) = \sum_{m=0}^{M-1} \sum_{k=0}^{N-1} c_{k,m} x_1(n-m) \|a_{k+1}|x_1(n-m)| + jb_{k+1}|x_2(n-m)|\|^k \quad (14)$$

$$y_2(n) = \sum_{m=0}^{M-1} \sum_{k=0}^{N-1} c_{k,m} x_2(n-m) \|a_{k+1}|x_2(n-m)| + jb_{k+1}|x_1(n-m)|\|^k \quad (15)$$

where $y_i(n)$ is a predistorted output signal of a digital predistorter for band i (1=1, 2 for a concurrent dual-band transmitter), M represents a memory depth of the new baseband model, N is the nonlinear order of the new baseband model (i.e., an order of nonlinearity compensated for by the digital predistorters), $c_{k,m}$ are complex valued predistortion coefficients for the digital predistorter for each of the frequency bands, $x_1$ is the digital input signal for the first band, $x_2$ is the digital input signal for the second band, and where $a_{k+}$, and $b_{k+1}$ are pre-calculated (k+1)-th order envelope coupling factors between $x_1$ and $x_2$. Importantly, the set of predistortion coefficients $c_{k,m}$ is the same for each of the frequency bands. In other words, the same set of predistortion coefficients $c_{k,m}$ is used to configure each of the digital predistorters. Thus, the number of predistortion coefficients required by the new baseband model of Equations (14) and (15) is half the number of predistortion coefficients required by the conventional 2D-MMP baseband model of Equations (3) and (4).

The envelope coupling factors $a_{k+}$, and $b_{k+1}$ are pre-calculated (i.e., are not adaptively configured) using the following algorithm. Using the dual-band scenario with $7^{th}$ order nonlinearity and no memory terms as an example, the output of the power amplifier (or likewise the combined output of the digital predistorters) can be defined as:

$$y(n)=c_1(n)\Re\{x(n)\}+c_3(n)\Re\{x(n)\}^3+$$
$$c_5(n)\Re\{x(n)\}^5+c_7(n)\Re\{x(n)\}^7 \qquad (16)$$

If only the terms that are located at the two carrier frequencies $\omega_1$ and $\omega_2$ are considered and taking out all common scalars (which are 3, 10, and 35 for $c_3$, $c_5$, and $c_7$, respectively), Equation (16) can be re-written for the two frequency bands as:

$$y_1(n) = c_1 x_1(n) + c_3 x_1(n)|x_1(n)|^2 + 2c_3 x_1(n)|x_2(n)|^2 + \qquad (17)$$
$$c_5 x_1(n)|x_1(n)|^4 + 6c_5 x_1(n)|x_1(n)|^2|x_2(n)|^2 + 3c_5 x_1(n)|x_2(n)|^4 +$$
$$c_7 x_1(n)|x_1(n)|^6 + 18c_7 x_1(n)|x_1(n)|^2|x_2(n)|^4 +$$
$$12c_7 x_1(n)|x_1(n)|^4|x_2(n)|^2 + 4c_7 x_1(n)|x_2(n)|^6$$

$$y_2(n) = c_1 x_2(n) + c_3 x_2(n)|x_2(n)|^2 + 2c_3 x_2(n)|x_1(n)|^2 + \qquad (18)$$
$$c_5 x_2(n)|x_2(n)|^4 + 6c_5 x_2(n)|x_1(n)|^2|x_2(n)|^2 + 3c_5 x_2(n)|x_1(n)|^4 +$$
$$c_7 x_2(n)|x_2(n)|^6 + 18c_7 x_2(n)|x_2(n)|^2|x_1(n)|^4 +$$
$$12c_7 x_2(n)|x_2(n)|^4|x_1(n)|^2 + 4c_7 x_2(n)|x_1(n)|^6$$

From the 2D-DPD baseband model of Equations (1) and (2), if M=1 and N=7, then Equations (1) and (2) become:

$$y_1(n) = c^{(1)}_{0,0,0} x_1(n) + c^{(1)}_{2,0,0} x_1(n)|x_1(n)|^2 + \qquad (19)$$
$$c^{(1)}_{2,2,0} x_1(n)|x_2(n)|^2 + c^{(1)}_{4,0,0} x_1(n)|x_1(n)|^4 +$$
$$c^{(1)}_{4,2,0} x_1(n)|x_1(n)|^2|x_2(n)|^2 + c^{(1)}_{4,4,0} x_1(n)|x_2(n)|^4 +$$
$$c^{(1)}_{6,0,0} x_1(n)|x_1(n)|^6 + c^{(1)}_{6,2,0} x_1(n)|x_1(n)|^4|x_2(n)|^2 +$$
$$c^{(1)}_{6,4,0} x_1(n)|x_1(n)|^2|x_2(n)|^4 + c^{(1)}_{6,6,0} x_1(n)|x_2(n)|^6$$

$$y_2(n) = c^{(2)}_{0,0,0} x_2(n) + c^{(2)}_{2,0,0} x_2(n)|x_2(n)|^2 + \qquad (20)$$
$$c^{(2)}_{2,2,0} x_2(n)|x_1(n)|^2 + c^{(2)}_{4,0,0} x_2(n)|x_2(n)|^4 +$$
$$c^{(2)}_{4,2,0} x_2(n)|x_2(n)|^2|x_1(n)|^2 + c^{(2)}_{4,4,0} x_2(n)|x_1(n)|^4 +$$
$$c^{(2)}_{6,0,0} x_2(n)|x_2(n)|^6 + c^{(2)}_{6,2,0} x_2(n)|x_2(n)|^4|x_1(n)|^2 +$$
$$c^{(2)}_{6,4,0} x_2(n)|x_2(n)|^2|x_1(n)|^4 + c^{(2)}_{6,6,0} x_2(n)|x_1(n)|^6$$

Comparing Equations (19) and (20) to Equations (17) and (18), it can be seen that the number of parameters (i.e., predistortion coefficients) is half. It can also be observed that the basis functions for $y_1(n)$ are $|x_1(n)|^2$, $2|x_2(n)|^2$, $|x_1(n)|^4$, $6|x_1(n)|^2|x_2(n)|^2$, $3|x_2(n)|^4$, $|x_1(n)|^6$, $18|x_2(n)|^4|x_1(n)|^4$, $12|x_2(n)|^2$, and $4|x_2(n)|^6$. Similarly, the basis functions for $y_2(n)$ are $|x_2(n)|^2$, $2|x_1(n)|^2$, $|x_2(n)|^4$, $6|x_1(n)|^2|x_2(n)|^2$, $3|x_1(n)|^4$, $|x_2(n)|^6$, $18|x_2(n)|^2|x_1(n)|^4$, $12|x_2(n)|^4|x_1(n)|^2$, and $4|x_1(n)|^6$. From this observation, one is reminded of an envelope calculation in the complex domain.

Now, if the new baseband model of Equations (14) and (15) is considered, for M=1 and N=7, the new baseband model can be re-written as:

$$y_1(n) = c_{0,0} x_1(n) + a_3^2 \cdot c_{2,0} x_1(n)|x_1(n)|^2 + \qquad (21)$$
$$b_3^2 \cdot c_{2,0} x_1(n)|x_2(n)|^2 + a_5^4 \cdot c_{4,0} x_1(n)|x_1(n)|^4 +$$
$$2a_5^2 b_5^2 \cdot c_{4,0} x_1(n)|x_1(n)|^2|x_2(n)|^2 + b_5^4 \cdot c_{4,0} x_1(n)|x_2(n)|^4 +$$
$$a_7^6 \cdot c_{6,0} x_1(n)|x_1(n)|^6 + 3a_7^4 b_7^2 \cdot c_{6,0} x_1(n)|x_1(n)|^4|x_2(n)|^2 +$$
$$3a_7^2 b_7^4 \cdot c_{6,0} x_1(n)|x_1(n)|^2|x_2(n)|^4 + b_7^6 \cdot c_{6,0} x_1(n)|x_2(n)|^6$$

$$y_2(n) = c_{0,0} x_2(n) + a_3^2 \cdot c_{2,0} x_2(n)|x_2(n)|^2 + \qquad (22)$$
$$b_3^2 \cdot c_{2,0} x_2(n)|x_1(n)|^2 + a_5^4 \cdot c_{4,0} x_2(n)|x_2(n)|^4 +$$
$$2a_5^2 b_5^2 \cdot c_{4,0} x_2(n)|x_2(n)|^2|x_1(n)|^2 + b_5^4 \cdot c_{4,0} x_2(n)|x_1(n)|^4 +$$
$$a_7^6 \cdot c_{6,0} x_2(n)|x_2(n)|^6 + 3a_7^4 b_7^2 \cdot c_{6,0} x_2(n)|x_2(n)|^4|x_1(n)|^2 +$$
$$3a_7^2 b_7^4 \cdot c_{6,0} x_2(n)|x_2(n)|^2|x_1(n)|^4 + b_7^6 \cdot c_{6,0} x_2(n)|x_1(n)|^6$$

where the coefficients a and b are real numbers.

By comparing Equations (21) and (22) with Equations (17) and (18), the following relationships can be defined as illustrated below in Table 1.

TABLE 1

| $a_3^2 \cdot c_{2,0} = c_3$ | $b_3^2 \cdot c_{2,0} = 2c_3$ | — | — |
|---|---|---|---|
| $a_5^4 \cdot c_{4,0} = c_5$ | $2a_5^2 b_5^2 \cdot c_{4,0} = 6c_5$ | $b_5^4 \cdot c_{4,0} = 3c_5$ | — |
| $a_7^6 \cdot c_{6,0} = c_7$ | $3a_7^4 b_7^2 \cdot c_{6,0} = 12c_7$ | $3a_7^2 b_7^4 \cdot c_{6,0} = 18c_7$ | $b_7^6 \cdot c_{6,0} = 4c_7$ |

From Table 1, it can be derived that the coefficients $a_3$, $a_5$, and $a_7$ can be set to 1, while $b_3$ can be set to $\sqrt{2}$, $b_5$ can be set to $\sqrt{3}$ or $4\sqrt{3}$, and $b_7$ can be set to 2, $4\sqrt{6}$, or $3\sqrt{2}$. Note that since $b_5$ and $b_7$ can be multiple different values, the actual values used in implementation may be the optimal values for that particular implementation. The process described above for determining the values for the envelope coupling factors $a_{k+}$, and $b_{k+1}$ can be extended to any desired memory-order and any desired order of nonlinearity.

FIG. 4 illustrates a concurrent dual-band transmitter 46 that utilizes the new baseband model described above according to one embodiment of the present disclosure. As illustrated, the concurrent dual-band transmitter 46 includes baseband sources 48-1 and 48-2 (e.g., modem(s)), up-sampling circuitry 50-1 and 50-2, a digital predistortion subsystem 52 that includes digital predistorters 54-1 and 54-2, upconversion circuitry 56-1 and 56-2, combining circuitry 58, quadrature modulation circuitry 60, and power amplifier circuitry 62 connected as shown.

The baseband source 48-1 provides a digital input signal, which in this embodiment is a baseband signal, for a first frequency band of a concurrent dual-band signal to be transmitted by the concurrent dual-band transmitter 46. Likewise, the baseband source 48-2 provides a digital input signal, which in this embodiment is a baseband signal, for a second frequency band of the concurrent dual-band signal to be transmitted by the concurrent dual-band transmitter 46. The up-sampling circuitries 50-1 and 50-2 up-sample the digital input signals to a desired sampling rate. The digital predistorter 54-1 processes the up-sampled digital input signals to provide a first predistorted input signal for the first frequency band of the concurrent multi-band signal, and the digital predistorter 54-2 processes the up-sampled digital input signals to provide a second predistorted input signal for the second frequency band of the concurrent multi-band signal. The digital predistorters 54-1 and 54-2 provide the predistorted input signals according to the new baseband model of Equations (14) and (15). Importantly, according to the new baseband model, the both the digital predistorter 54-1 and the digital predistorter 54-2 are configured by the same set of predistortion coefficients $c_{k,m}$.

The upconversion circuitry 56-1 up-converts the predistorted input signal output by the digital predistorter 54-1 to a desired carrier frequency $\omega_1$ for the first frequency band of the concurrent dual-band signal. Likewise, the upconversion circuitry 56-2 up-converts the predistorted input signal output by the digital predistorter 54-2 to a desired carrier frequency $\omega_2$ for the second frequency band of the concurrent dual-band signal. The up-converted signals are then combined by the combining circuitry 58 and modulated by the quadrature modulation circuitry 60 to provide a predistorted concurrent dual-band input signal for the power amplifier circuitry 62. It should be noted that digital-to-analog conversion can occur before upconversion for an analog upconversion implementation. Alternatively, digital-to-analog conversion may occur after upconversion for a digital upconversion implementation. While not essential for understanding the concepts disclosed herein, for more information regarding digital upconversion, the interested reader is directed to U.S. Patent Application Publication No. 2010/0098191 A1, entitled METHODS AND SYSTEMS FOR PROGRAMMABLE DIGITAL UP-CONVERSION, filed on Oct. 20, 2008, and published on Apr. 22, 2010 and U.S. Patent Application Publication No. 2013/0241757 A1, entitled PROGRAMMABLE DIGITAL UP-CONVERSION FOR CONCURRENT MULTI-BAND SIGNALS, filed on Jun. 7, 2012, and published on Sep. 19, 2013, both of which are hereby incorporated herein by reference for their teachings related to digital upconversion. The power amplifier circuitry 62 amplifies the concurrent dual-band input signal to provide the concurrent dual-band signal to be transmitted by the concurrent dual-band transmitter 46. While not illustrated, subsequent to amplification, the concurrent dual-band signal is preferably filtered to remove out-of-band intermodulation distortion prior to transmission.

In order to provide adaptive configuration of the digital predistorters 54-1 and 54-2 via the same set of predistortion coefficients $c_{k,m}$, the concurrent dual-band transmitter 46 includes a feedback path that includes an observation receiver 64 and a single adaptor 66 (hereinafter "adaptor 66"). The observation receiver 64 includes an attenuator 68, filters 70-1 and 70-2, downconversion and demodulation circuitry 72-1 and 72-2, and combining circuitry 74 connected as shown. The attenuator 68 has an input that is coupled to the output of the power amplifier circuitry 62 via a coupler 76. The attenuator 68 is configured to attenuate the concurrent dual-band signal output by the power amplifier circuitry 62 by a factor G, where G corresponds to a gain of the power amplifier circuitry 62. The filters 70-1 and 70-2 have pass-bands centered at the carrier frequencies $\omega_1$ and $\omega_2$ of the concurrent dual-band signal, respectively.

In operation, the filter 70-1 filters the attenuated concurrent dual-band signal to provide a feedback signal for the first frequency band of the concurrent dual-band signal. Likewise, the filter 70-2 filters the attenuated concurrent dual-band signal to provide a feedback signal for the second frequency band of the concurrent dual-band signal. The downconversion and demodulation circuitry 72-1 downconverts, demodulates, and digitizes the feedback signal for the first frequency band to provide a digital feedback signal for the first frequency band. Likewise, the downconversion and demodulation circuitry 72-2 downconverts, demodulates, and digitizes the feedback signal for the second frequency band to provide a digital feedback signal for the second frequency band. In this embodiment, the feedback signals for the first and second frequency bands are both at baseband.

The combining circuitry 74 combines the digital feedback signals for the first and second frequency bands to provide a combined digital feedback signal. Because the digital feedback signals for both of the frequency bands are at baseband, frequency bands, or spectrums, for the digital feedback signals for the two frequency bands overlap as illustrated in FIG. 5. When compensating for up to $5^{th}$ order distortion for example, if the two digital input signals have a same bandwidth B, then the bandwidth of the combined digital feedback signal is 5×B due to bandwidth expansion resulting from the distortion or nonlinearity of the power amplifier circuitry 62. If the two digital input signals have different bandwidths $B_1$ and $B_2$, then when compensating for up to $5^{th}$ order distortion, the bandwidth of the combined digital feedback signal is the larger of $5 \times B_1$ and $5 \times B_2$. As such, by combining the digital feedback signals for the two frequency bands at baseband, the frequency bands of the two digital feedback signals overlap, which in turn substantially reduces the bandwidth of the combined feedback signal as compared to the bandwidth of the concurrent dual-band signal at the output of the power amplifier circuitry 62. As a result of the reduced bandwidth, a sampling rate requirement for the feedback path is substantially reduced, which in turn reduces the complexity and cost of the concurrent dual-band transmitter 46.

Returning to FIG. 4, the concurrent dual-band transmitter 46 also includes combining circuitry 78 that combines the two up-sampled digital input signals to provide a combined reference signal. As discussed above, in this embodiment, the up-sampled digital input signals are at baseband. As such, after combining the two up-sampled digital input signals, the frequency bands of the two up-sampled digital input signals overlap in the combined reference signal in same manner as described above with respect to the digital feedback signals in the combined feedback signal (but without bandwidth expansion).

The adaptor 66 adaptively configures the set of predistortion coefficients $c_{k,m}$ for the digital predistorters 54-1 and 54-2 in the new baseband model of Equations (14) and (15) based on the combined reference signal and the combined feedback signal. Specifically, the adaptor 66 utilizes any suitable technique (e.g., LMS) to compute or otherwise determine values for the set of predistortion coefficients $c_{k,m}$ that minimize an error between the combined reference signal and the combined feedback signal. In this manner, the single adaptor 66 configures a single set of predistortion coefficients $c_{k,m}$ that, according to the new baseband model, is used to configure each of the digital predistorters 54-1 and 54-2.

FIG. 6 is a flow chart that illustrates the operation of the transmit chain of the concurrent dual-band transmitter 46 of FIG. 4 according to one embodiment of the present disclosure. While the steps of the process of FIG. 6 are illustrated as being performed in a particular order, it should be noted that unless explicitly stated or otherwise required, the steps may be performed in any desired order. This also applies to the steps of any other processes illustrated and described herein. As illustrated in FIG. 6, the digital predistorters 54-1 and 54-2 digitally predistort the digital input signals to provide the predistorted digital input signals for each frequency band (step 1000). More specifically, in the embodiment of FIG. 4, the digital predistorter 54-1 processes the up-sampled digital input signals to provide the predistorted digital input signal for the first frequency band, and the digital predistorter 54-2 processes the up-sampled digital input signals to provide the predistorted digital input signal for the second frequency band. Next, the predistorted digital input signals are up-converted by the upconversion circuitry 56-1 and 56-2 to the carrier frequencies $\omega_1$ and $\omega_2$, respectively (step 1002). The predistorted up-converted, or radio frequency, signals are then combined by the combining circuitry 58 to provide a predistorted combined signal (step 1004). Notably, in one alternative embodiment, the predistorted signals may be combined prior to upconversion. The predistorted combined signal is then quadrature modulated to provide the predistorted concurrent dual-band input signal for the power amplifier circuitry 62 (step 1006). Lastly, the predistorted concurrent dual-band input signal is amplified by the power amplifier circuitry 62 (step 1008).

FIG. 7 illustrates the operation of the feedback path of the concurrent dual-band transmitter 46 of FIG. 4 according to one embodiment of the present disclosure. As illustrated, the observation receiver 64 processes the concurrent multi-band signal (more specifically in this example, a concurrent dual-band signal) received from the output of the power amplifier circuitry 62 via the coupler 76 to provide the combined feedback signal (step 2000). The adaptor 66 then adaptively configures the set of predistortion coefficients for the digital predistorters 54-1 and 54-2 based on the combined feedback signal and the combined reference signal (step 2002).

FIG. 8 illustrates the concurrent dual-band transmitter 46 according to another embodiment of the present disclosure. This embodiment is substantially the same as that of FIG. 4 but where the component signals of the combined feedback signal and the component signals of the combined reference signal are tuned to intermediate frequencies in such a manner as to reduce or minimize the bandwidth of the combined feedback signal and thus the sampling rate requirement for Analog-to-Digital (A/D) conversion in the feedback path. More specifically, in this embodiment, after downconversion and demodulation, the digital feedback signal for the first frequency band is tuned to a first intermediate frequency $\omega_{IF1}$ via tuning circuitry 80-1. In a similar manner, the digital feedback signal for the second frequency band is tuned to a second intermediate frequency $\omega_{IF2}$ via tuning circuitry 80-2. As a result, in the combined feedback signal, the signal component for the first frequency band is tuned to the first intermediate frequency $\omega_{IF1}$ and the signal component for the second frequency band is tuned to the second intermediate frequency $\omega_{IF2}$.

In the same manner, the concurrent dual-band transmitter 46 includes tuning circuitry 82-1 that tunes the up-sampled digital input signal for the first frequency band to the first intermediate frequency $\omega_{IF1}$ and tuning circuitry 82-2 that tunes the up-sampled digital input signal for the second frequency band to the second intermediate frequency $\omega_{IF2}$. As a result, in the combined reference signal, the signal component for the first frequency band is tuned to the first intermediate frequency $\omega_{IF1}$ and the signal component for the second frequency band is tuned to the second intermediate frequency $\omega_{IF2}$. The adaptor 66 then adaptively configures the set of predistortion coefficients, and thus the digital predistorters 54-1 and 54-2, in such a manner as to minimize the error between the combined reference signal and the combined feedback signal.

In one embodiment, a frequency separation between the first and second intermediate frequencies $\omega_{IF1}$ and $\omega_{IF2}$ is greater than or equal to a minimum frequency separation below which the two frequency bands in the combined feedback signal begin to overlap for the maximum order of distortion to be compensated for by the digital predistorters 54-1 and 54-2. So, for the fifth order case, the frequency separation between the first and second intermediate frequencies $\omega_{IF1}$ and $\omega_{IF2}$ is greater than or equal to $5/2 B_1 + 5/2 B_2$, where $B_1$ is the bandwidth of the digital input signal for the first frequency band and $B_2$ is the bandwidth for the digital input signal for the second frequency band. Thus, in one particular embodiment, the two intermediate frequencies are selected such that:

$$IF1 = -\frac{5(B_1 + B_2)}{2} + \frac{5}{2}B_1 = -\frac{5}{2}B_2, \text{ and} \quad (23)$$

$$IF2 = \frac{5(B_1 + B_2)}{2} - \frac{5}{2}B_2 = \frac{5}{2}B_1. \quad (24)$$

By selecting the two intermediate frequencies in this manner, the bandwidth of the combined feedback signal is substantially reduced as compared to the bandwidth of the concurrent multi-band signal (or in other words the observed bandwidth of the observation receiver 64). As a result, the sampling rate requirement for A/D conversion in the feedback path is substantially reduced. Note that while the first and second intermediate frequencies $\omega_{IF1}$ and $\omega_{IF2}$ can be selected to avoid overlap of the frequency bands of the component signals in the combined reference signal and the combined feedback signal, the first and second intermediate frequencies $\omega_{IF1}$ and $\omega_{IF2}$ are not limited thereto. The first and second intermediate frequencies $\omega_{IF1}$ and $\omega_{IF2}$ may alternatively be selected to allow some amount of overlap between the frequency bands of the combined feedback signal or even the combined reference signal.

Thus far, the embodiments have focused on predistortion that compensates for in-band intermodulation and cross-modulation distortion. In these embodiments, as well as the conventional architectures discussed above, out-of-band intermodulation products (e.g., IM3 distortion) can typically be removed using analog filtering at the output of the power amplifier circuitry 24, 62. However, depending on the frequency separation between the frequency bands of the concurrent multi-band signal, there are situations where the out-of-band intermodulation products fall close to the desired frequency bands (i.e., the frequency bands of the concurrent multi-band signal) and therefore, it is challenging, costly, or simply impossible from a system perspective to filter them by means of analog filters. An architecture that utilizes digital predistortion to compensate for both in-band intermodulation products and IM3 distortion products is disclosed in Seyed Aidin Bassam et al., "Channel-Selective Multi-Cell Digital Predistorter for Multi-Carrier Transmitters," IEEE Transactions on Communications, Vol. 60, No. 8, August 2012, pp. 2344-2352 (hereinafter "Bassam"). However, the architecture proposed in Bassam uses different types of baseband models for the in-band and out-of-band intermodulation products (i.e., Kroneckar products vs. memory polynomials). Also, the predistortion for the IM3 frequency bands in the architecture disclosed in Bassam is generated using the pre-distorted in-band waveforms, or signals. Therefore, the architecture of Bassam assumes a dependency between the in-band and out-of-band intermodulation distortions, which is not always the case. As a result of these simplifications, as disclosed in Bassam, only a modest performance improvement was observed in laboratory measurements.

In one embodiment, the new baseband model may be expanded to compensate for IM3 distortion. By doing so, a memory-polynomial based baseband model for both in-band and out-of-band predistortion is provided. Further, a single adaptor and a single set of predistortion coefficients can be utilized for separate predistorters for each of the desired and IM3 frequency bands. Using the dual-band scenario as an example, by substituting Equation (9) into Equation (8) and by expanding the terms according to Equation (10), one can derive the following equation for the terms located around the frequencies $\omega_1$, $\omega_2$, $2\omega_1 - \omega_2$, and $2\omega_2 - \omega_1$:

$$y(n) = c_1(x_1(n)e^{j\omega_1 nT} + x_2(n)e^{j\omega_2 nT}) + c_3 \begin{pmatrix} (x_1(n)|x_1(n)|^2 + 2x_1(n)|x_2(n)|^2)e^{j\omega_1 nT} + \\ (x_2(n)|x_2(n)|^2 + 2x_2(n)|x_1(n)|^2)e^{j\omega_2 nT} + \\ (x_1(n)^2 x_2(n)^*)e^{j(2\omega_1 - \omega_2)nT} + \\ (x_2(n)^2 x_1(n)^*)e^{j(2\omega_2 - \varpi_1)nT} \end{pmatrix} + \quad (25)$$

$$c_5 \begin{pmatrix} (x_1(n)|x_1(n)|^4 + 6x_1(n)|x_1(n)|^2|x_2(n)|^2 + 3x_1(n)|x_2(n)|^4)e^{j\omega_1 nT} + \\ (x_2(n)|x_2(n)|^4 + 6x_2(n)|x_2(n)|^2|x_1(n)|^2 + 3x_2(n)|x_1(n)|^4)e^{j\omega_2 nT} + \\ (2x_1(n)^2|x_1(n)|^2 x_2(n)^* + 3x_1(n)^2|x_2(n)|^2 x_2(n)^*)e^{j(2\omega_1 - \varpi_2)nT} + \\ (2x_2(n)^2|x_2(n)|^2 x_1(n)^* + 3x_2(n)^2|x_1(n)|^2 x_1(n)^*)e^{j(2\omega_2 - \varpi_1)nT} \end{pmatrix}$$

Equation (25) can be re-written as four equations, one for each frequency band (including the two IM3 frequency bands), as follows:

$$y_{\omega_1}(n) = \begin{pmatrix} c_1 x_1(n) + c_3 x_1(n)|x_1(n)|^2 + 2c_3 x_1(n)|x_2(n)|^2 + \\ c_5 x_1(n)|x_1(n)|^4 + 6c_5 x_1(n)|x_1(n)|^2|x_2(n)|^2 + \\ 3c_5 x_1(n)|x_2(n)|^4 \end{pmatrix} \times e^{j\omega_1 nT} \quad (26)$$

$$y_{\omega_2}(n) = \begin{pmatrix} c_1 x_2(n) + c_3 x_2(n)|x_2(n)|^2 + 2c_3 x_2(n)|x_1(n)|^2 + \\ c_5 x_2(n)|x_2(n)|^4 + 6c_5 x_2(n)|x_2(n)|^2|x_1(n)|^2 + \\ 3c_5 x_2(n)|x_1(n)|^4 \end{pmatrix} \times e^{j\omega_2 nT} \quad (27)$$

$$y_{2\omega_1 - \omega_2}(n) = \quad (28)$$
$$\begin{pmatrix} c_3 x_1(n)^2 x_2(n)^* + 2c_5 x_1(n)^2|x_1(n)|^2 x_2(n)^* + \\ 3c_5 x_1(n)^2|x_2(n)|^2 x_2(n)^* \end{pmatrix} \times e^{j(2\omega_1 - \omega_2)nT}$$

$$y_{2\omega_2 - \omega_1}(n) = \quad (29)$$
$$\begin{pmatrix} c_3 x_2(n)^2 x_1(n)^* + 2c_5 x_2(n)^2|x_2(n)|^2 x_1(n)^* + \\ 3c_5 x_2(n)^2|x_1(n)|^2 x_1(n)^* \end{pmatrix} \times e^{j(2\omega_2 - \omega_1)nT}$$

One can notice in Equations (25)-(29) that the two frequency bands for the concurrent dual-band signal (i.e., the frequency bands centered at $\omega_1$ and $\omega_2$) and the two IM3 frequency bands (i.e., the frequency bands centered at $2\omega_1 - \omega_2$, and $2\omega_2 - \omega_1$) share the same set of coefficients and that only three coefficients ($c_1$, $c_3$, $c_5$) need to be calculated. As such, the new baseband model requires a reduced number of coefficients, which greatly simplifies the complexity of the Digital Predistortion (DPD) system and that of the concurrent dual-band transmitter.

Based on this knowledge that the same set of coefficients can be used for each of the frequency bands of the concurrent dual-band signal as well as each of the IM3 frequency bands, the inventors have developed a new baseband model that uses the same set of predistortion coefficients for each of the frequency bands of the concurrent dual-band signal as well as each of the IM3 frequency bands. Specifically, the new baseband model that also includes IM3 is defined as:

$$y_{\omega_1}(n) = \quad (30)$$
$$\sum_{m=0}^{M-1} \sum_{k=0}^{N-1} c_{k,m} x_1(n-m) |a_{k+1}^{(inBand)}|x_1(n-m)| + jb_{k+1}^{(inBand)}|x_2(n-m)|\|^k$$

-continued $$y_{\omega_2}(n) = \quad (31)$$
$$\sum_{m=0}^{M-1} \sum_{k=0}^{N-1} c_{k,m} x_2(n-m) |a_{k+1}^{(inBand)}|x_2(n-m)| + jb_{k+1}^{(inBand)}|x_1(n-m)|\|^k$$

$$y_{2\omega_1 - \omega_2}(n) = \sum_{m=0}^{M-1} \sum_{k=1}^{N-1} c_{k,m} x_1(n-m)^2 \quad (32)$$
$$x_2(n-m)^* |a_{k+1}^{(IM3)}|x_1(n-m)| + jb_{k+1}^{(IM3)}|x_2(n-m)|\|^{k-1}$$

$$y_{2\omega_2 - \omega_1}(n) = \sum_{m=0}^{M-1} \sum_{k=1}^{N-1} c_{k,m} x_2(n-m)^2 \quad (33)$$
$$x_1(n-m)^* |a_{k+1}^{(IM3)}|x_2(n-m)| + jb_{k+1}^{(IM3)}|x_1(n-m)|\|^{k-1}$$

where $y_{\omega_1}(n)$ is the predistorted output signal of a digital predistorter for the first frequency band of the concurrent dual-band signal, $y_{\omega_2}(n)$ is the predistorted output signal of a digital predistorter for the second frequency band of the concurrent dual-band signal, $y_{2\omega_1 - \omega_2}(n)$ is the predistorted output signal of a digital predistorter for the first IM3 frequency band, $y_{2\omega_2 - \omega_1}(n)$ is the predistorted output signal of a digital predistorter for the second IM3 frequency band, M represents a memory depth of the new baseband model, N is the nonlinear order of the new baseband model (i.e., an order of nonlinearity compensated for by the digital predistorters), $c_{k,m}$ are complex valued predistortion coefficients for the digital predistorter for each of the frequency bands of the concurrent dual-band signal and each of the IM3 frequency bands, $x_1$ is the digital input signal for the first band, $x_2$ is the digital input signal for the second band, $a_{k+1}^{inBand}$ and $b_{k+1}^{inBand}$ are pre-calculated (k+1)-th order envelope coupling factors between $x_1$ and $x_2$ for frequency bands of the concurrent dual-band signal, and $a_{k+1}^{IM3}$ and $b_{k+1}^{IM3}$ are pre-calculated (k+1)-th order envelope coupling factors between $x_1$ and $x_2$ for the IM3 frequency bands. Importantly, the set of predistortion coefficients $c_{k,m}$ is the same for each of the frequency bands and each of the IM3 frequency bands. In other words, the same set of predistortion coefficients $c_{k,m}$ is used to configure each of the digital predistorters. The envelope coupling factors $a_{k+1}^{inBand}$ and $b_{k+1}^{inBand}$ as well as the envelope coupling factors $a_{k+1}^{IM3}$ and $b_{k+1}^{IM3}$ can be calculated using the process described above with respect to the envelope coupling factors $a_{k+1}$ and $b_{k+1}$.

FIG. 9 illustrates one embodiment of the concurrent dual-band transmitter 46 that utilizes the new baseband model that further compensates for IM3 according to one embodiment of the present disclosure. In this embodiment, the digital predistortion subsystem 52 further includes digital predistorters 84-1 and 84-2 that process the up-sampled digital input signals to provide predistorted digital input signals that compensate for IM3 in frequency bands centered at $2\omega_1-\omega_2$ and $2\omega_2-\omega_1$, respectively. As discussed below, the new baseband model can be further defined such that the same set of predistortion coefficients is utilized by both the digital predistorters 54-1 and 54-2 and the digital predistorters 84-1 and 84-2. The concurrent dual-band transmitter 46 also includes upconversion circuitry 86-1 and 86-2 configured to up-convert the predistorted digital input signals output by the digital predistorters 84-1 and 84-2 to $2\omega_1-\omega_2$ and $2\omega_2-\omega_1$, respectively. The up-converted signals from the upconversion circuitries 86-1 and 86-2 are then combined along with the up-converted signals from the upconversion circuitries 56-1 and 56-2 for the two frequency bands of the concurrent multi-band signal to provide the predistorted combined signal at the output of the combining circuitry 58. The predistorted combined signal is then quadrature modulated to provide the concurrent dual-band input signal, which is then amplified by the power amplifier circuitry 62 to provide the concurrent dual-band signal.

An adaptation subsystem and observation receiver 88 of the concurrent dual-band transmitter 46 adaptively configures the digital predistorters 54-1, 54-2, 84-1, and 84-2 based on the new baseband model that further compensates for IM3. Specifically, as illustrated in FIG. 10, the adaptation subsystem and observation receiver 88 includes the observation receiver 64 and an adaptation subsystem 65, which includes the adaptor 66. The observation receiver 64 includes the attenuator 68, the filters 70-1 and 70-2, the downconversion and demodulation circuitry 72-1 and 72-2, and the combining circuitry 74 as discussed above. However, in this embodiment, the observation receiver 64 also includes filters 90-1 and 90-2, downconversion and demodulation circuitry 92-1 and 92-2, combining circuitry 94-1 and 94-2, and adjustment circuitry 96-1 and 96-2. In operation, the input of the attenuator 68 is coupled to the output of the power amplifier circuitry 62. The attenuator 68 attenuates the concurrent dual-band signal. The filters 70-1 and 70-2 filter the attenuated concurrent dual-band signal to provide feedback signals for the two frequency bands of the concurrent dual-band signal centered at $\omega_1$ and $\omega_2$, as discussed above. The filter 90-1 filters the attenuated concurrent dual-band signal to provide a feedback signal for the IM3 frequency band centered at $2\omega_1-\omega_2$. Likewise, the filter 90-2 filters the attenuated concurrent dual-band signal to provide a feedback signal for the IM3 frequency band centered at $2\omega_2-\omega_1$.

The downconversion and demodulation circuitry 72-1 downconverts and demodulates the feedback signal for the first frequency band of the concurrent dual-band signal (i.e., the frequency band centered at $\omega_1$) to provide a digital baseband feedback signal for the first frequency band. Likewise, the downconversion and demodulation circuitry 72-2 downconverts and demodulates the feedback signal for the second frequency band of the concurrent dual-band signal (i.e., the frequency band centered at $\omega_2$) to provide a digital baseband feedback signal for the second frequency band. Conversely, the downconversion and demodulation circuitry 92-1 downconverts and demodulates the feedback signal for the first IM3 frequency band (i.e., the IM3 frequency band centered at $2\omega_1-\omega_2$) to provide a digital feedback signal for the first IM3 frequency band at a first intermediate frequency ($-IF1$). In a similar manner, the downconversion and demodulation circuitry 92-2 downconverts and demodulates the feedback signal for the second IM3 frequency band (i.e., the IM3 frequency band centered at $2\omega_2-\omega_1$) to provide a digital feedback signal for the second IM3 frequency band at a second intermediate frequency ($+IF2$).

Next, the combining circuitry 94-1 combines the digital feedback signal for the first IM3 frequency band and the digital baseband feedback signal for the first frequency band of the concurrent dual-band signal to provide a first combined signal. Likewise, the combining circuitry 94-2 combines the digital feedback signal for the second IM3 frequency band and the digital baseband feedback signal for the second frequency band of the concurrent dual-band signal to provide a second combined signal. The adjustment circuitry 96-1 performs time, phase, and/or gain adjustments for the first combined signal relative to a first reference signal, which as illustrated in FIG. 9 is the up-sampled digital input signal for the first frequency band. Likewise, the adjustment circuitry 96-2 performs time, phase, and/or gain adjustments for the second combined signal relative to a second reference signal, which as illustrated in FIG. 9 is the up-sampled digital input signal for the second frequency band. The combining circuitry 74 then combines the adjusted first and second combined signals to provide a combined digital feedback signal for the concurrent dual-band signal.

Importantly, as illustrated with respect to the combined digital feedback signal at the output of the combining circuitry 74 in FIG. 10, the first and second intermediate frequencies ($-IF1$ and $+IF2$) are selected such that the IM3 frequency bands (C and D) in the combined digital feedback signal do not overlap with a combined frequency band (A+B) for the first frequency band (A) and the second frequency band (B) in the combined digital feedback signal. The values of IF1 and IF2 are determined by the signal bandwidths as well as the nonlinear order of the DPD system. More specifically, as illustrated in FIG. 11, the bandwidth of the combined baseband signal A+B is:

$$N \times \max(BW_1, BW_2) \tag{34}$$

where N is the order of nonlinearity, $BW_1$ is the bandwidth of the digital input signal for the first frequency band, and $BW_2$ is the bandwidth of the digital input signal for the first frequency band, the bandwidth of the C band is:

$$2 \times BW_1 + BW_2 + (N-3) \times \max(BW_1, BW_2), \text{ and} \tag{35}$$

the bandwidth of the D band is:

$$BW_1 + 2 \times BW_2 + (N-3) \times \max(BW_1, BW_2). \tag{36}$$

Therefore, minimum values for the intermediate frequencies IF1 and IF2 are given by:

$$IF1 = \frac{2 \times BW_1 + BW_2 + (2N-3) \times \max(BW_1 + BW_2)}{2} \tag{37}$$

$$IF2 = \frac{BW_1 + 2 \times BW_2 + (2N-3) \times \max(BW_1 + BW_2)}{2} \tag{38}$$

Note, however, that the intermediate frequencies IF1 and IF2 can be greater than the values defined by Equations (37) and (38), but are preferably substantially less than values at which the bandwidth of the combined feedback signal is equal to the total bandwidth of the concurrent dual-band signal including the IM3 frequency bands.

Returning to FIG. 10, the two reference signals (REF 1 and REF 2), which in this embodiment are the up-sampled digital input signals, are combined by combining circuitry 98 to provide a combined reference signal. Combining circuitry 100 receives the combined reference signal and the combined feedback signal and outputs an Observation Receiver (OBS), which may also be referred to herein as an error signal (e), that is a difference between the combined reference signal and the combined feedback signal. The adaptor 66 then adaptively configures the set of predistortion coefficients $c_{k,m}$ using any suitable adaptation algorithm (e.g., LMS) to minimize the error signal or, in other words, to minimize the difference between the combined reference signal and the combined feedback signal. Again, the adaptor 66 adaptively configures a single set of predistortion coefficients $c_{k,m}$ which according to the new baseband model is utilized by each of the digital predistorters 54-1, 54-2, 84-1, and 84-2. Note that while in this embodiment the observation signal input to the adaptor 66 is the error signal, in an alternative embodiment, the output of the combining circuitry 74 and the reference signals may be input to the adaptor 66 where error is determined internally at the adaptor 66, as is done in many of the other embodiments disclosed herein (e.g., FIGS. 4, 8, 12, 13, and 15).

FIG. 12 illustrates the adaptation subsystem and observation receiver 88 of FIG. 9 according to another embodiment of the present disclosure. This embodiment is similar to that of FIG. 10 but where the observation receiver 64 downconverts the feedback signals for each of the frequency bands of the concurrent dual-band signal and each of the IM3 frequency bands to baseband and combines the resulting digital baseband feedback signals to provide a combined digital baseband feedback signal that is representative of both of the frequency bands of the concurrent dual-band signal and both of the IM3 frequency bands. As a result, a bandwidth of the combined digital baseband feedback signal is reduced as compared to that of FIG. 10, which in turn reduces the sampling rate requirements of the adaptor 66.

More specifically, the adaptation subsystem and observation receiver 88 of FIG. 12 includes the observation receiver 64 and an adaptation subsystem 65 including the adaptor 66. The observation receiver 64 includes the attenuator 68, the filters 70-1 and 70-2 for the two frequency bands of the concurrent dual-band signal, the filters 90-1 and 90-2 for the two IM3 frequency bands, the downconversion and demodulation circuitry 72-1 and 72-2 for the two frequency bands of the concurrent dual-band signal, downconversion and demodulation circuitry 102-1 and 102-2 for the two IM3 frequency bands, the combining circuitries 94-1 and 94-2, the adjustment circuitry 96-1 and 96-2, and the combining circuitry 74 as discussed above. However, in this embodiment, the downconversion and demodulation circuitry 102-1 and 102-2 for the two IM3 frequency bands downconvert the feedback signals for the two IM3 frequency bands to baseband rather than some intermediate frequencies. As a result, all four frequency bands overlap at baseband in the combined digital baseband feedback signal output by the combiner 74, as is also illustrated in FIG. 12.

The adaptor 66 adaptively configures the set of predistortion coefficients for the digital predistorters 54-1, 54-2, 84-1, and 84-2 based on the combined digital feedback signal output by the observation receiver 64 and the two reference signals. Specifically, in one embodiment, the adaptor 66 utilizes any suitable technique to compute or otherwise determine values for the set of predistortion coefficients that minimize the following cost function for the baseband model of Equations (30) through (33):

$$COST(n) = \left| obs(n) - \left( \begin{array}{l} \sum_{m=0}^{M-1} \sum_{k=0}^{N-1} g_{k,m} x_1(n-m) |a_{k+1}^{(inBand)}|x_1(n-m)| + jb_{k+1}^{(inBand)}|x_2(n-m)||^k + \\ \sum_{m=0}^{M-1} \sum_{k=0}^{N-1} g_{k,m} x_2(n-m) |a_{k+1}^{(inBand)}|x_2(n-m)| + jb_{k+1}^{(inBand)}|x_1(n-m)||^k + \\ \sum_{m=0}^{M-1} \sum_{k=2}^{N-1} g_{k,m} x_1(n-m)^2 x_2(n-m)^* |a_{k+1}^{(IM3)}|x_1(n-m)| + jb_{k+1}^{(IM3)}|x_2(n-m)||^{k-2} + \\ \sum_{m=0}^{M-1} \sum_{k=2}^{N-1} g_{k,m} x_2(n-m)^2 x_1(n-m)^* |a_{k+1}^{(IM3)}|x_2(n-m)| + jb_{k+1}^{(IM3)}|x_1(n-m)||^{k-2} \end{array} \right) \right|^2$$

where obs(n) is the distorted concurrent dual-band signal reconstructed by the observation receiver 64 (i.e., the combined digital feedback signal output by the observation receiver 64), and $x_1(n)$ and $x_2(n)$ are the up-sampled digital baseband input signal to the digital predistorters 54-1, 54-2, 84-1, and 84-2, which are referenced as reference signals REF 1 and REF 2. This minimization may be achieved in practice directly via classical least squares approaches, or iteratively using a stochastic gradient (e.g., LMS) approach.

FIG. 13 illustrates the adaptation subsystem and observation receiver 88 of FIG. 9 according to yet another embodiment of the present disclosure. In this embodiment, since the same set of predistortion coefficients are used for all four digital predistorters 54-1, 54-2, 84-1, and 84-2, the observation receiver 64 provides a digital baseband feedback signal that is representative of only one of the frequency bands, which in this example, is the frequency band centered at the carrier frequency $\omega_1$ of the concurrent dual-band signal. Note, however, that the observation receiver 64 may alternatively provide a digital baseband feedback signal that is representative of one of the other frequency bands (e.g., the frequency band centered at the carrier frequency $\omega_2$ of the concurrent dual-band signal).

More specifically, in this embodiment, the adaptation subsystem and observation receiver 88 includes the observation receiver 64 and the adaptation subsystem 65 including the adaptor 66. The observation receiver 64 includes the attenuator 68, a filter 70 for the frequency band of the concurrent dual-band signal that is being observed (which again, in this example, is the frequency band centered on the carrier frequency $\omega_1$ of the concurrent dual-band signal), downconversion and demodulation circuitry 72 for the frequency band of the concurrent dual-band signal being observed, and adjustment circuitry 96 for adjusting time, phase, and/or gain, connected as shown. In operation, the input of the attenuator 68 is coupled to the output of the power amplifier circuitry 62. The attenuator 68 attenuates the concurrent dual-band signal. The filter 70 filters the attenuated concurrent dual-band signal to provide a feedback signal for the frequency band of the concurrent dual-band signal centered at $\omega_1$.

The downconversion and demodulation circuitry 72 downconverts and demodulates the feedback signal for the frequency band of the concurrent dual-band signal being observed (i.e., the frequency band centered at $\omega_1$) to provide a digital baseband feedback signal for the frequency band being observed. The adjustment circuitry 96 performs time, phase, and/or gain adjustments for the digital baseband feedback signal relative to a reference signal, which in this example is, as illustrated in FIG. 9, the up-sampled digital input signal for the first frequency band (referenced as REF 1).

The adaptor 66 then adaptively configures the digital predistorters 54-1, 54-2, 84-1, and 84-1 based on the digital feedback signal output by the observation receiver 64 and the two reference signals. Specifically, in one embodiment, the adaptor 66 utilizes any suitable technique to compute or otherwise determine values for the set of predistortion coefficients that minimize the following cost function for the baseband model of Equations (30) through (33):

$$COST(n) = \left| obs(n) - \sum_{m=0}^{M-1} \sum_{k=0}^{N-1} g_{k,m} x_1(n-m) \right.$$
$$\left. a_{k+1}^{(inBand)} |x_1(n-m)| + jb_{k+1}^{(inBand)} |x_2(n-m)| \right|^k \Bigg|^2$$

where obs(n) is the digital feedback signal output by the observation receiver 64, and $x_1(n)$ and $x_2(n)$ are the up-sampled digital baseband input signal to the digital predistorters 54-1, 54-2, 84-1, and 84-2, which are referenced as reference signals REF 1 and REF 2. This minimization may be achieved in practice directly via classical least squares approaches, or iteratively using a stochastic gradient (e.g., LMS) approach. Note that, in one alternative embodiment, the observation receiver 64 observes the second band (i.e., Band B) of the concurrent dual-band signal in which case the cost function that is minimized by the adaptor 66 is:

$$COST(n) = \left| obs(n) - \sum_{m=0}^{M-1} \sum_{k=0}^{N-1} g_{k,m} x_2(n-m) |a_{k+1}^{(inBand)}| |x_2(n-m)| + \right.$$
$$\left. jb_{k+1}^{(inBand)} |x_1(n-m)| \right|^k \Bigg|^2$$

While the embodiments of FIGS. 9, 10, 12, and 13 use the new baseband model to provide a single set of predistortion coefficients to configure both the digital predistorters 54-1 and 54-2 for the frequency bands of the concurrent dual-band signal and the digital predistorters 84-1 and 84-2 for the IM3 frequency bands, the present disclosure is not limited thereto. More specifically, other baseband models that define separate sets of predistortion coefficients for each of the digital predistorters for the desired frequency bands of the concurrent dual-band signal and the frequency bands of the out-of-band intermodulation distortion (e.g., IM3 frequency bands) may be used. In this regard, FIG. 14 illustrates a dual-band transmitter 104 that utilizes separate digital predistorters to compensate for both in-band intermodulation distortion and out-of-band intermodulation distortion and an adaptation subsystem and observation receiver 106 that independently configures the digital predistorters using separate sets of predistortion coefficients according to one embodiment of the present disclosure. Before describing the dual-band transmitter 104 of FIG. 14 in detail, a description of two different baseband models that may be utilized to model the digital predistorters of the dual-band transmitter 104 is provided.

First Baseband Model:

For the first baseband model, let us assume the following non-linear function for seventh order distortions:

$$y(n) = \Re\{x(n)\} + \Re\{x(n)\}^3 + \Re\{x(n)\}^5 + \Re\{x(n)\}^7 \quad (39)$$

where y(n) is the distorted dual-band signal and x(n) is the reference dual-band signal represented by:

$$x(n) = x_1(n) \cdot e^{j\omega_1 nT} + x_2(n) \cdot e^{j\omega_2 nT} \quad (40)$$

where $x_1(n)$ represents the first frequency band located around the carrier frequency $\omega_1$ and $x_2(n)$ represents the second frequency band located around the carrier $\omega_2$. $\Re\{arg\}$ is the real part of the argument and is defined as:

$$\Re\{arg\} = \frac{(arg + arg^*)}{2} \quad (41)$$

where $(arg)^*$ is the complex conjugate operator.

By substituting Equation (40) into Equation (39) and by expanding the terms according to Equation (41), one can derive the following equations for the terms located around the IM3 frequencies $2\omega_1 - \omega_2$ and $2\omega_2 - \omega_1$ (i.e., in the IM3 frequency bands):

$$y_{2\omega_1-\omega_2}(n) = x_1(n)^2 x_2(n)^* + 2x_1(n)^2 |x_1(n)|^2 x_2(n)^* + \quad (42)$$
$$3x_1(n)^2 |x_2(n)|^2 x_2(n)^* + 3x_1(n)^2 |x_1(n)|^4 x_2(n)^* +$$
$$12x_1(n)^2 |x_1(n)|^2 |x_2(n)|^2 x_2(n)^* + 6x_1(n)^2 |x_2(n)|^4 x_2(n)^*$$

$$y_{2\omega_2-\omega_1}(n) = x_2(n)^2 x_1(n)^* + 2x_2(n)^2 |x_2(n)|^2 x_1(n)^* + \quad (43)$$
$$3x_2(n)^2 |x_1(n)|^2 x_1(n)^* + 3x_2(n)^2 |x_2(n)|^4 x_1(n)^* +$$
$$12x_2(n)^2 |x_2(n)|^2 |x_1(n)|^2 x_1(n)^* + 6x_2(n)^2 |x_1(n)|^4 x_1(n)^*$$

Based on this knowledge, Equations (42) and (43) can be generalized as two equations as follows:

$$y_{2\omega_1-\omega_2}(n) = \quad (44)$$
$$\sum_{m=0}^{M-1} \sum_{k=0}^{N-3} \sum_{j=0}^{k} c_{k,j,m}^{2\omega_1-\omega_2} x_1(n-m)^2 x_2(n-m)^* |x_1(n-m)|^{k-j} |x_2(n-m)|^j$$

$$y_{2\omega_2-\omega_1}(n) = \quad (45)$$
$$\sum_{m=0}^{M-1} \sum_{k=0}^{N-3} \sum_{j=0}^{k} c_{k,j,m}^{2\omega_2-\omega_1} x_2(n-m)^2 x_1(n-m)^* |x_2(n-m)|^{k-j} |x_1(n-m)|^j$$

where M is the memory depth, N is the non-linear order and $c_{k,j,m}^i$ are the predistortion coefficients for band i, where the superscript i is to be replaced by the band frequency $2\omega_1 - \omega_2$ or $2\omega_2 - \omega_1$. The variables k and j of Equations (44) and (45) are incremented by two when considering the odd terms only. Note that the scalars from Equations (42) and (43) have been absorbed into the predistortion coefficients $c_{k,j,m}^i$.

The total baseband model for both the frequency bands of the concurrent dual-band signal and the IM3 frequency bands can then be defined as:

$$y_{\omega_1}(n) = \sum_{m=0}^{M-1}\sum_{k=0}^{N-1}\sum_{j=0}^{k} c_{k,j,m}^{\omega_1} x_1(n-m)|x_1(n-m)|^{k-j}|x_2(n-m)|^j \quad (46)$$

$$y_{\omega_2}(n) = \sum_{m=0}^{M-1}\sum_{k=0}^{N-1}\sum_{j=0}^{k} c_{k,j,m}^{\omega_2} x_2(n-m)|x_2(n-m)|^{k-j}|x_1(n-m)|^j \quad (47)$$

$$y_{2\omega_1-\omega_2}(n) = \quad (48)$$
$$\sum_{m=0}^{M-1}\sum_{k=0}^{N-3}\sum_{j=0}^{k} c_{k,j,m}^{2\omega_1-\omega_2} x_1(n-m)^2 x_2(n-m)^*|x_1(n-m)|^{k-j}|x_2(n-m)|^j$$

$$y_{2\omega_2-\omega_1}(n) = \quad (49)$$
$$\sum_{m=0}^{M-1}\sum_{k=0}^{N-3}\sum_{j=0}^{k} c_{k,j,m}^{2\omega_2-\omega_1} x_2(n-m)^2 x_1(n-m)^*|x_2(n-m)|^{k-j}|x_1(n-m)|^j$$

Second Baseband Model:

In this model, the assumption is made that the non-linear terms in Equation (39) are multiplied by coefficients so that the non-linear equation becomes:

$$y(n) = c_1 \Re\{x(n)\} + c_3 \Re\{x(n)\}^3 + c_5 \Re\{x(n)\}^5 + c_7 \Re\{x(n)\}^7 \quad (50)$$

By substituting Equation (40) into Equation (50) and by expanding the terms accordingly to Equation (41), one can derive the following equations for the terms located around the IM3 frequencies $2\omega_1-\omega_2$ and $2\omega_2-\omega_1$, assuming that each band needs a different set of coefficients:

$$y_{2\omega_1-\omega_2}(n) = c_3^{2\omega_1-\omega_2} x_1(n)^2 x_2(n)^* + 2c_5^{2\omega_1-\omega_2} x_1(n)^2|x_1(n)|^2 x_2(n)^* + \quad (51)$$
$$3c_5^{2\omega_1-\omega_2} x_1(n)^2|x_2(n)|^2 x_2(n)^* + 3c_7^{2\omega_1-\omega_2} x_1(n)^2|x_1(n)|^4 x_2(n)^* +$$
$$12c_7^{2\omega_1-\omega_2} x_1(n)^2|x_1(n)|^2|x_2(n)|^2 x_2(n)^* +$$
$$6c_7^{2\omega_1-\omega_2} x_1(n)^2|x_2(n)|^4 x_2(n)^*$$

$$y_{2\omega_2-\omega_1}(n) = c_3^{2\omega_2-\omega_1} x_2(n)^2 x_1(n)^* + 2c_5^{2\omega_2-\omega_1} x_2(n)^2|x_2(n)|^2 x_1(n)^* + \quad (52)$$
$$3c_5^{2\omega_2-\omega_1} x_2(n)^2|x_1(n)|^2 x_1(n)^* + 3c_7^{2\omega_2-\omega_1} x_2(n)^2|x_2(n)|^4 x_1(n)^* +$$
$$12c_7^{2\omega_2-\omega_1} x_2(n)^2|x_2(n)|^2|x_1(n)|^2 x_1(n)^* +$$
$$6c_7^{2\omega_2-\omega_1} x_2(n)^2|x_1(n)|^4 x_1(n)^*$$

From the baseband model of Equations (44) and (45), if M=1 and N=7, then Equations (44) and (45) become:

$$y_{2\omega_1-\omega_2}(n) = c_{0,0,0}^{2\omega_1-\omega_2} x_1(n)^2 x_2(n)^* + c_{2,0,0}^{2\omega_1-\omega_2} x_1(n)^2|x_1(n)|^2 x_2(n)^* + \quad (53)$$
$$c_{2,2,0}^{2\omega_1-\omega_2} x_1(n)^2|x_2(n)|^2 x_2(n)^* + c_{4,0,0}^{2\omega_1-\omega_2} x_1(n)^2|x_1(n)|^4 x_2(n)^* +$$
$$c_{4,2,0}^{2\omega_1-\omega_2} x_1(n)^2|x_1(n)|^2|x_2(n)|^2 x_2(n)^* + c_{4,4,0}^{2\omega_1-\omega_2} x_1(n)^2|x_2(n)|^4 x_2(n)^*$$

$$y_{2\omega_2-\omega_1}(n) = c_{0,0,0}^{2\omega_2-\omega_1} x_2(n)^2 x_1(n)^* + c_{2,0,0}^{2\omega_2-\omega_1} x_2(n)^2|x_2(n)|^2 x_1(n)^* + \quad (54)$$
$$c_{2,2,0}^{2\omega_2-\omega_1} x_2(n)^2|x_1(n)|^2 x_1(n)^* + c_{4,0,0}^{2\omega_2-\omega_1} x_2(n)^2|x_2(n)|^4 x_1(n)^* +$$
$$c_{4,2,0}^{2\omega_2-\omega_1} x_2(n)^2|x_2(n)|^2|x_1(n)|^2 x_1(n)^* + c_{4,4,0}^{2\omega_2-\omega_1} x_2(n)^2|x_1(n)|^4 x_1(n)^*$$

Comparing Equations (53) and (54) to Equations (51) and (52), it can be seen that the number of predistortion coefficients is half. It can also be observed that the basis functions for $y_{2\omega_1-\omega_2}$ are $2|x_1(n)|^2$, $3|x_2(n)|^2$, $3|x_1(n)|^4$, $12|x_1(n)|^2|x_2(n)|^2$ and $6|x_2(n)|^4$. Similarly, the basis functions for $y_{2\omega_2-\omega_1}$ are $2|x_2(n)|^2$, $3|x_1(n)|^2$, $3|x_2(n)|^4$, $12|x_2(n)|^2|x_1(n)|^2$ and $6|x_1(n)|^4$. From this observation, one is reminded of an envelope calculation in the complex domain. Therefore, the new baseband model can be re-written as:

$$y_{2\omega_1-\omega_2}(n) = \sum_{m=0}^{M-1}\sum_{k=2}^{N-1} g_{k,m}^{2\omega_1-\omega_2} x_1(n-m)^2 x_2(n-m)^* \quad (55)$$
$$\left| a_{k+1}^{2\omega_1-\omega_2}|x_1(n-m)| + jb_{k+1}^{2\omega_1-\omega_2}|x_2(n-m)| \right|^{k-2}$$

$$y_{2\omega_2-\omega_1}(n) = \sum_{m=0}^{M-1}\sum_{k=2}^{N-1} g_{k,m}^{2\omega_2-\omega_1} x_2(n-m)^2 x_1(n-m)^* \quad (56)$$
$$\left| a_{k+1}^{2\omega_2-\omega_1}|x_2(n-m)| + jb_{k+1}^{2\omega_2-\omega_1}|x_1(n-m)| \right|^{k-2}$$

where $a_{k+1}^i$ and $b_{k+1}^i$ are real-valued pre-calculated k-th order envelope coupling factors between $x_1(n)$ and $x_2(n)$ for band i and $g_{k,m}^i$ are the predistortion coefficients for a given non-linear order for band i, where band i is the IM3 band for $2\omega_1-\omega_2$ for Equation (55) and $2\omega_2-\omega_1$ for Equation (56). Now, if the baseband model of Equations (55) and (56) is considered, for M=1 and N=7, the new baseband model can be re-written as:

$$y_{2\omega_1-\omega_2}(n) = \quad (57)$$
$$g_{2,0}^{2\omega_1-\omega_2} x_1(n)^2 x_2(n)^* + \left(a_5^{2\omega_1-\omega_2}\right)^2 \times g_{4,0}^{2\omega_1-\omega_2} x_1(n)^2|x_1(n)|^2 x_2(n)^* +$$
$$\left(b_5^{2\omega_1-\omega_2}\right)^2 \times g_{4,0}^{2\omega_1-\omega_2} x_1(n)^2|x_2(n)|^2 x_2(n)^* +$$
$$\left(a_7^{2\omega_1-\omega_2}\right)^4 \times g_{6,0}^{2\omega_1-\omega_2} x_1(n)^2|x_1(n)|^4 x_2(n)^* +$$
$$2\left(a_7^{2\omega_1-\omega_2}\right)^2 \left(b_7^{2\omega_1-\omega_2}\right)^2 \times g_{6,0}^{2\omega_1-\omega_2} x_1(n)^2|x_1(n)|^2|x_2(n)|^2 x_2(n)^* +$$
$$\left(b_7^{2\omega_1-\omega_2}\right)^4 \times g_{6,0}^{2\omega_1-\omega_2} x_1(n)^2|x_2(n)|^4 x_2(n)^*$$

$$y_{2\omega_2-\omega_1}(n) = \quad (58)$$
$$g_{2,0}^{2\omega_2-\omega_1} x_2(n)^2 x_1(n)^* + \left(a_5^{2\omega_2-\omega_1}\right)^2 \times g_{4,0}^{2\omega_2-\omega_1} x_2(n)^2|x_2(n)|^2 x_1(n)^* +$$
$$\left(b_5^{2\omega_2-\omega_1}\right)^2 \times g_{4,0}^{2\omega_2-\omega_1} x_2(n)^2|x_1(n)|^2 x_1(n)^* +$$
$$\left(a_7^{2\omega_2-\omega_1}\right)^4 \times g_{6,0}^{2\omega_2-\omega_1} x_2(n)^2|x_2(n)|^4 x_1(n)^* +$$
$$2\left(a_7^{2\omega_2-\omega_1}\right)^2 \left(b_7^{2\omega_2-\omega_1}\right)^2 \times g_{6,0}^{2\omega_2-\omega_1} x_2(n)^2|x_2(n)|^2|x_1(n)|^2 x_1(n)^* +$$
$$\left(b_7^{2\omega_2-\omega_1}\right)^4 \times g_{6,0}^{2\omega_2-\omega_1} x_2(n)^2|x_1(n)|^4 x_1(n)^*$$

By comparing Equations (57) and (58) with Equations (55) and (56), the following relationships can be defined as illustrated below in Table 2.

TABLE 2

| | | |
|---|---|---|
| $g_{2,m}^i = c_{3,m}^i$ | — | — |
| $(a_5^i)^2 g_{4,m}^i = 2c_{5,m}^i$ | $(b_5^i)^2 g_{4,m}^i = 3c_{5,m}^i$ | — |
| $(a_7^i)^4 g_{6,m}^i = 3c_{7,m}^i$ | $2(a_7^i)^2 (a_7^i)^2 g_{6,m}^i = 12c_{7,m}^i$ | $(b_7^i)^4 g_{6,m}^i = 6c_{7,m}^i$ |

From Table 2, it can be derived that the coefficient $a_5^i$ is $\sqrt{2}$ while $b_5^i$ $\sqrt{3}$ Similarly, $a_7^i$ can be set to $4\sqrt{3}$ or $\sqrt{6}$, and $b_7^i$ can be set to $4\sqrt{6}$ or $\sqrt{6}$. The theoretical range for $a_{k+1}^i$ and $b_{k+1}^i$ can be estimated using the above relationships and it is fixed for a given non-linear order. However, it is preferable that $a_{k+1}^i$ and $b_{k+1}^i$ be determined through measurements so that the values used in operation are the optimal values for that particular implementation. For example, this could be done by a calibration routine that evaluates the Error Vector Magnitude (EVM) or the Adjacent Channel Leakage Ratio (ACLR) when sweeping the theoretical range for those coefficients.

The complete second baseband model for both the desired frequency bands of the concurrent dual-band signal and the IM3 frequency bands is then defined as:

$$y_{\omega_1}(n) = \sum_{m=0}^{M-1} \sum_{k=2}^{N-1} g_{k,m}^{\omega_1} x_1(n-m) |a_{k+1}^{\omega_1}|x_1(n-m)| + jb_{k+1}^{\omega_1}|x_k(n-m)||^k \quad (59)$$

$$y_{\omega_2}(n) = \sum_{m=0}^{M-1} \sum_{k=2}^{N-1} g_{k,m}^{\omega_2} x_2(n-m) |a_{k+1}^{\omega_2}|x_2(n-m)| + jb_{k+1}^{\omega_2}|x_k(n-m)||^k \quad (60)$$

$$y_{2\omega_1-\omega_2}(n) = \sum_{m=0}^{M-1} \sum_{k=2}^{N-1} g_{k,m}^{2\omega_1-\omega_2} x_1(n-m)^2 x_2(n-m)^* \quad (61)$$

$$\left| a_{k+1}^{2\omega_1-\omega_2}|x_1(n-m)| + jb_{k+1}^{2\omega_1-\omega_2}|x_2(n-m)| \right|^{k-2}$$

$$y_{2\omega_2-\omega_1}(n) = \sum_{m=0}^{M-1} \sum_{k=2}^{N-1} g_{k,m}^{2\omega_2-\omega_1} x_2(n-m)^2 x_1(n-m)^* \quad (62)$$

$$\left| a_{k+1}^{2\omega_2-\omega_1}|x_2(n-m)| + jb_{k+1}^{2\omega_2-\omega_1}|x_1(n-m)| \right|^{k-2}$$

Note that the second baseband model described above is less complex than the first baseband model. Specifically, the second baseband model uses a reduced number of predistortion coefficients as compared to that of the first baseband model. The reduction in the number of coefficients is because all of the terms associated with a given non-linear order and memory depth are multiplied by a single coefficient.

Now, returning back to the discussion of the dual-band transmitter 104 of FIG. 14, the dual-band transmitter 104 includes baseband sources 108-1 and 108-2 (e.g., modem(s)), up-sampling circuitry 110-1 and 110-2, a digital predistortion subsystem 112 that includes digital predistorters 114-1 and 114-2 for the frequency bands of the concurrent dual-band signal as well as digital predistorters 114-3 and 114-4 for the IM3 frequency bands, modulation and upconversion circuitry 116-1 through 116-4, combining circuitry 118, and power amplifier circuitry 120 connected as shown. Note that, in this example, quadrature modulation is performed in the modulation and upconversion circuitry 116-1 through 116-4. However, in another embodiment, quadrature modulation may be performed after the combining circuitry 118 and before the power amplifier circuitry 120 as is the case in, for example, the embodiment of FIG. 4.

In operation, the baseband source 108-1 provides a digital input signal, which in this embodiment is a baseband signal, for a first frequency band of the concurrent dual-band signal to be transmitted by the dual-band transmitter 104. Likewise, the baseband source 108-2 provides a digital input signal, which in this embodiment is a baseband signal, for a second frequency band of the concurrent dual-band signal to be transmitted by the dual-band transmitter 104. The up-sampling circuitries 110-1 and 110-2 up-sample the digital input signals to a desired sampling rate. The digital predistorter 114-1 processes the up-sampled digital input signals to provide a first predistorted input signal for the first frequency band of the concurrent multi-band signal, and the digital predistorter 114-2 processes the up-sampled digital input signals to provide a second predistorted input signal for the second frequency band of the concurrent multi-band signal. In a similar manner, the digital predistorter 114-3 processes the up-sampled digital input signals to provide a first IM3 compensation signal for a first IM3 frequency band (referenced as IM3$_L$, which is the frequency band centered at $2\omega_1-\omega_2$), and the digital predistorter 114-4 processes the up-sampled digital input signals to provide a second IM3 compensation signal for a second IM3 frequency band (referenced as IM3$_H$, which is the frequency band centered at $2\omega_2-\omega_1$). Preferably, the digital predistorters 114-1 through 114-4 provide the predistorted digital baseband input signals and the IM3 compensation signals according to either the baseband model of Equations (46) through (49) or the baseband model of Equations (59) through (62). According to the aforementioned baseband models, the digital predistorters 114-1 through 114-4 are configured by separate sets of predistortion coefficients.

The modulation and upconversion circuitry 116-1 modulates and up-converts the predistorted input signal output by the digital predistorter 114-1 to provide a corresponding upconverted signal at a desired carrier frequency $\omega_1$ for the first frequency band of the concurrent dual-band signal. Likewise, the upconversion and modulation circuitry 116-2 modulates and up-converts the predistorted input signal output by the digital predistorter 114-2 to provide a corresponding upconverted signal at a desired carrier frequency $\omega_2$ for the second frequency band of the concurrent dual-band signal. In a similar manner, the upconversion and modulation circuitry 116-3 modulates and up-converts the IM3 compensation signal output by the digital predistorter 114-3 to provide a corresponding upconverted signal at a desired IM3 frequency $2\omega_1-\omega_2$ for the first IM3 frequency band. Likewise, the upconversion and modulation circuitry 116-4 modulates and up-converts the IM3 compensation signal output by the digital predistorter 114-4 to provide a corresponding upconverted signal at a desired IM3 frequency $2\omega_2-\omega_1$ for the second IM3 frequency band.

The upconverted signals are then combined by the combining circuitry 118 to provide a predistorted concurrent dual-band input signal for the power amplifier circuitry 120. It should be noted that digital-to-analog conversion can occur before upconversion for an analog upconversion implementation. Alternatively, digital-to-analog conversion may occur after upconversion for a digital upconversion implementation. The power amplifier circuitry 120 amplifies the concurrent dual-band input signal to provide the concurrent dual-band signal to be transmitted by the dual-band transmitter 104.

In order to provide adaptive configuration of the digital predistorters 114-1 through 114-2, the concurrent dual-band transmitter 104 includes a feedback path that includes the adaptation subsystem and observation receiver 106 that is coupled to an output of the power amplifier circuitry 120 via a coupler 122. In general, the adaptation subsystem and observation receiver 106 adaptively configures the separate sets of predistortion coefficients utilized by the digital predistorters 114-1 through 114-4 using a suitable baseband model. Preferably, the baseband model is either the baseband model of Equations (46) through (49) or the baseband model of Equations (59) through (62).

One embodiment of the adaptation subsystem and observation receiver 106 is illustrated in FIG. 15. As illustrated, the adaptation subsystem and observation receiver 106 includes an observation receiver 124 and an adaptation subsystem 125 including adaptors 126-1 and 126-2. The observation receiver 124 includes an attenuator 128, filters 130-1 through 130-4, downconversion and demodulation circuitry 132-1 through 132-4, tuning circuitry 134-1 and 134-2, combining circuitry 136-1 and 136-2, and adjustment circuitry 138-1 and 138-2 connected as shown. The attenuator 128 has an input that is coupled to the output of the power amplifier circuitry 120 via the coupler 122. The attenuator 128 is configured to attenuate the concurrent dual-band signal output by the power amplifier circuitry 120 by a factor G, where G corresponds to a gain of the power amplifier circuitry 120. The filters 130-1 and 130-2 have pass-bands centered at the carrier frequencies $\omega_1$ and $\omega_2$ of the concurrent dual-band signal, respectively. Similarly, the filters 130-3 and 130-4 have passbands centered at the IM3 frequencies $2\omega_1-\omega_2$ and $2\omega_2-\omega_1$, respectively.

In operation, the filter 130-1 filters the attenuated concurrent dual-band signal to provide a feedback signal for the first frequency band of the concurrent dual-band signal. Likewise, the filter 130-2 filters the attenuated concurrent dual-band signal to provide a feedback signal for the second frequency band of the concurrent dual-band signal. In a similar manner, the filter 130-3 filters the attenuated concurrent dual-band signal to provide a feedback signal for the first IM3 frequency band, and the filter 130-4 filters the attenuated concurrent dual-band signal to provide a feedback signal for the second IM3 frequency band. The downconversion and demodulation circuitry 132-1 downconverts, demodulates, and digitizes the feedback signal for the first frequency band of the concurrent dual-band signal to provide a digital feedback signal for the first frequency band of the concurrent dual band signal. Likewise, the downconversion and demodulation circuitry 132-2 downconverts, demodulates, and digitizes the feedback signal for the second frequency band of the concurrent dual-band signal to provide a digital feedback signal for the second frequency band of the concurrent dual-band signal. In a similar manner, the downconversion and demodulation circuitry 132-3 downconverts, demodulates, and digitizes the feedback signal for the first IM3 frequency band to provide a digital feedback signal for the first IM3 frequency band, and the downconversion and demodulation circuitry 132-4 downconverts, demodulates, and digitizes the feedback signal for the second IM3 frequency band to provide a digital feedback signal for the second IM3 frequency band. At this point, all of the digital feedback signals are at baseband.

In this embodiment, the tuning circuitry 134-1 tunes the digital feedback signal for the first IM3 frequency band to a first intermediate frequency ($-IF_1$), and the tuning circuitry 134-2 tunes the digital feedback signal for the second IM3 frequency band to a second intermediate frequency ($IF_2$). The combining circuitry 136-1 then combines the digital feedback signal for the first frequency band of the concurrent dual-band signal and the tuned digital feedback signal for the first IM3 frequency band to provide a first combined digital feedback signal. As illustrated, the first intermediate frequency ($-IF_1$) is selected such that the two frequency bands do not overlap in the first combined digital feedback signal, but at the same time a separation between the two frequency bands is minimized, which in turn minimizes a bandwidth of the first combined digital feedback signal.

In a similar manner, the combining circuitry 136-2 then combines the digital feedback signal for the second frequency band of the concurrent dual-band signal and the tuned digital feedback signal for the second IM3 frequency band to provide a second combined digital feedback signal. As illustrated, the second intermediate frequency ($IF_2$) is selected such that the two frequency bands do not overlap in the second combined digital feedback signal, but at the same time a separation between the two frequency bands is minimized, which in turn minimizes a bandwidth of the second combined digital feedback signal.

The bandwidths of the different bands in the first and second combined digital feedback signals can be predicted from the baseband model as illustrated in FIG. 16. The values of the bandwidths of the different bands in the first and second combined digital feedback signal are determined by the bandwidths of the digital input signals for the two frequency bands of the concurrent dual-band signal as well as the DPD nonlinear order. Therefore, the minimum values for $IF_1$ and $IF_2$ can be determined based on the illustration in FIG. 16. Specifically, based on the illustration in FIG. 16, the minimum values for $IF_1$ and $IF_2$ can be calculated as:

$$IF_1 = \frac{3 \times BW_1 + BW_2 + (2 \times N - 4) \times \max(BW_1 + BW_2)}{2} \quad (63)$$

$$IF_2 = \frac{BW_1 + 3 \times BW_2 + (2 \times N - 4) \times \max(BW_1 + BW_2)}{2} \quad (64)$$

where $BW_1$ is the bandwidth of the digital input signal for the first frequency band of the concurrent dual-band signal and $BW_2$ is the bandwidth of the digital input signal for the second frequency band of the concurrent dual-band signal.

Returning to FIG. 15, the observation receiver 124 also includes the adjustment circuitry 138-1 and 138-2 that operates to adjust time alignment, phase, and/or gain of the first and second combined digital feedback signals based on the reference signals $x_1$ and $x_2$, respectively. The adaptor 126-1 adaptively configures the sets of predistortion coefficients for the digital predistorters 114-1 and 114-3 based on the first combined digital feedback signal and the two reference signals. Specifically, in one embodiment, the adaptor 126-1 utilizes any suitable technique to compute or otherwise determine values for the sets of predistortion coefficients that minimize the following cost function for the baseband model of Equations (46) through (49):

$$COST^{(1)}(n) = \left| obs_1(n) - \left( \sum_{m=0}^{M-1} \sum_{k=0}^{N-1} \sum_{j=0}^{k} c_{k,j,m}^{(\omega_1)} x_1(n-m)|x_1(n-m)|^{k-j}|x_2(n-m)|^j + \sum_{m=0}^{M-1} \sum_{k=0}^{N-3} \sum_{j=0}^{k} c_{k,j,m}^{2\omega_1-\omega_2} x_1(n-m)^2 x_2(n-m)^* |x_1(n-m)|^{k-j}|x_2(n-m)|^j e^{j2\pi IF_2 nT} \right) \right|^2$$

where $obs_1(n)$ is the distorted concurrent dual-band signal reconstructed by the observation receiver 124 (i.e., the adjusted first combined digital feedback signal), and $x_1(n)$ and $x_2(n)$ are the up-sampled digital baseband input signal to the digital predistorters 114-1 through 114-4. This minimization may be achieved in practice directly via classical least squares approaches, or iteratively using a stochastic gradient (i.e., LMS) approach.

Similarly, when using the baseband model of Equations (46) through (49), the adaptor 126-2 adaptively configures the sets of predistortion coefficients for the digital predistorters 114-2 and 114-4 based on the second combined digital feedback signal and the two reference signals to minimize the following cost function:

$$COST^{(2)}(n) = \left|obs_2(n) - \left(\begin{array}{c}\sum_{m=0}^{M-1}\sum_{k=0}^{N-1}\sum_{j=0}^{k} c_{k,j,m}^{(\omega_2)} x_2(n-m)|x_2(n-m)|^{k-j}|x_1(n-m)|^j + \\ \sum_{m=0}^{M-1}\sum_{k=0}^{N-3}\sum_{j=0}^{k} c_{k,j,m}^{2\omega_2-\omega_1} x_2(n-m)^2 x_1(n-m)^*|x_2(n-m)|^{k-j}|x_1(n-m)|^j e^{j2\pi lF_2 nT}\end{array}\right)\right|^2$$

In another embodiment, the adaptors 126-1 and 126-2 operate according to the baseband model of Equations (59) through (62). Specifically, the adaptor 126-1 utilizes any suitable technique to compute or otherwise determine values for the sets of predistortion coefficients for the digital predistorters 114-1 and 114-3 that minimize the following cost function for the baseband model of Equations (59) through (62):

LUT Look-Up Table

OBS Observation Receiver

Those skilled in the art will recognize improvements and modifications to the preferred embodiments of the present disclosure. All such improvements and modifications are considered within the scope of the concepts disclosed herein and the claims that follow.

$$COST^{(1)}(n) = \left|obs_1(n) - \left(\begin{array}{c}\sum_{m=0}^{M-1}\sum_{k=0}^{N-1} g_{k,m}^{\varpi_1} x_1(n-m)\left|a_{k+1}^{(\varpi_1)}|x_1(n-m)|+jb_{k+1}^{(\varpi_1)}|x_2(n-m)|\right|^k + \\ \sum_{m=0}^{M-1}\sum_{k=2}^{N-1} g_{k,m}^{2\omega_1-\varpi_2} x_1(n-m)^2 x_2(n-m)^*\left|a_{k+1}^{2\varpi_1-\varpi_2}|x_1(n-m)|+jb_{k+1}^{(2\varpi_1-\varpi_2)}|x_2(n-m)|\right|^{k-2} e^{-j2\pi lF_1 nT}\end{array}\right)\right|^2$$

Similarly, the adaptor 126-2 utilizes any suitable technique to compute or otherwise determine values for the sets of predistortion coefficients for the digital predistorters 114-2 and 114-4 that minimize the following cost function for the baseband model of Equations (59) through (62):

What is claimed is:

1. A concurrent multi-band transmitter, comprising:
   a digital predistortion subsystem comprising a plurality of digital predistorters configured to process a plurality of digital input signals for a plurality of frequency bands of $$COST^{(2)}(n) = \left|obs_2(n) - \left(\begin{array}{c}\sum_{m=0}^{M-1}\sum_{k=0}^{N-1} g_{k,m}^{\varpi_2} x_2(n-m)\left|a_{k+1}^{(\varpi_2)}|x_2(n-m)|+jb_{k+1}^{(\varpi_2)}|x_1(n-m)|\right|^k + \\ \sum_{m=0}^{M-1}\sum_{k=2}^{N-1} g_{k,m}^{2\omega_2-\varpi_1} x_2(n-m)^2 x_1(n-m)^*\left|a_{k+1}^{(2\varpi_2-\varpi_1)}|x_2(n-m)|+jb_{k+1}^{(2\varpi_2-\varpi_1)}|x_1(n-m)|\right|^{k-2} e^{j2\pi lF_2 nT}\end{array}\right)\right|^2$$

It should be noted that the discussion herein focuses on the dual-band scenario. However, it should be appreciated that the baseband models and architectures disclosed herein can be extended to more than two frequency bands and to higher order intermodulation bands if desired. Further, the baseband models and corresponding architectures disclosed herein that also compensate for IM3 can be extended to compensate for higher order intermodulation distortion (e.g., Fifth Order Intermodulation (IM5) distortion). Also, the DPD architectures disclosed herein utilize a direct learning adaptation technique. However, as will be appreciated by one of ordinary skill in the art upon reading this disclosure, indirect learning adaptation techniques may alternatively be used.

The following acronyms are used throughout this disclosure.

2D-DPD Dual-Band Digital Predistortion
2D-MMP 2D-Modified Memory Polynomial
ACLR Adjacent Channel Leakage Ratio
A/D Analog-to-Digital
DPD Digital Predistortion
EVM Error Vector Magnitude
IM3 Third-Order Intermodulation
IM5 Fifth-Order Intermodulation
LMS Least Mean Squares
LTE Long Term Evolution a concurrent multi-band signal to provide a plurality of predistorted digital input signals each being for a different one of the plurality of frequency bands of the concurrent multi-band signal and one or more intermodulation distortion compensation signals each being for a different one of one or more intermodulation distortion frequency bands;

circuitry configured to process the plurality of predistorted digital input signals and the one or more intermodulation distortion compensation signals to provide a predistorted concurrent multi-band signal;

power amplifier circuitry configured to amplify the predistorted concurrent multi-band signal to provide the concurrent multi-band signal; and an adaptation subsystem configured to adaptively configure the plurality of digital predistorters based on a memory polynomial based digital baseband model of the plurality of digital predistorters.

2. The transmitter of claim 1 wherein the one or more intermodulation distortion frequency bands comprise a plurality of intermodulation distortion frequency bands such that the one or more intermodulation distortion compensation signals comprise a plurality of intermodulation distortion compensation signals each being for a different one of the plurality of intermodulation distortion frequency bands, and the plurality of digital predistorters comprise:
a first plurality of digital predistorters comprising a separate digital predistorter for each of the plurality of frequency bands of the concurrent multi-band signal, the first plurality of digital predistorters configured to process the plurality of digital input signals to provide the plurality of predistorted digital input signals; and
a second plurality of digital predistorters comprising a separate digital predistorter for each of the plurality of intermodulation distortion frequency bands, the second plurality of digital predistorters configured to process the plurality of digital input signals to provide the plurality of intermodulation distortion compensation signals.

3. The transmitter of claim 2 wherein:
the adaptation subsystem comprises two or more adaptors configured to adaptively configure the plurality of digital predistorters based on the memory polynomial based digital baseband model of the plurality of digital predistorters; and
a number of adaptors in the two or more adaptors of the adaptation subsystem is less than a number of predistorters in the plurality of digital predistorters of the digital predistortion subsystem.

4. The transmitter of claim 2 wherein:
the adaptation subsystem comprises two or more adaptors configured to adaptively configure the plurality of digital predistorters based on the memory polynomial based digital baseband model of the plurality of digital predistorters; and
at least one adaptor of the two or more adaptors of the adaptation subsystem is configured to generate digital predistortion coefficients for at least two digital predistorters of the plurality of digital predistorters of the digital predistortion subsystem.

5. The transmitter of claim 4 wherein the at least two digital predistorters comprise:
a first digital predistorter configured to provide one of the plurality of predistorted digital input signals for one of the plurality of frequency bands of the concurrent multi-band signal; and
a second digital predistorter configured to provide one of the plurality of intermodulation distortion compensation signals for one of the plurality of intermodulation distortion frequency bands.

6. The transmitter of claim 5 wherein the at least one adaptor is configured to generate the digital predistortion coefficients for the at least two digital predistorters based on a combined digital feedback signal comprising a first component for the one of the plurality of frequency bands of the concurrent multi-band signal and a second component for the one of the plurality of intermodulation distortion frequency bands.

7. The transmitter of claim 6 further comprising an observation receiver configured to process the concurrent multi-band signal output by the power amplifier circuitry to provide the combined digital feedback signal such that a frequency band of the first component does not overlap with a frequency band of the second component within the combined digital feedback signal.

8. The transmitter of claim 2 wherein the adaptation subsystem comprises a single adaptor configured to adaptively configure the plurality of digital predistorters based on the memory polynomial based digital baseband model of the plurality of digital predistorters, wherein the memory polynomial based digital baseband model has a same set of predistortion coefficients for each of the plurality of digital predistorters.

9. The transmitter of claim 8 further comprising:
an observation receiver configured to process the concurrent multi-band signal output by the power amplifier circuitry to provide a combined digital feedback signal that is representative of both the plurality of frequency bands of the concurrent multi-band signal and the one or more intermodulation distortion frequency bands;
wherein the single adaptor is further configured to adaptively configure the plurality of digital predistorters based on the combined digital feedback signal.

10. The transmitter of claim 9 wherein the observation receiver comprises:
for each frequency band of the plurality of frequency bands of the concurrent multi-band signal, circuitry configured to process a component of the concurrent multi-band signal in the frequency band to provide a digital feedback signal for the frequency band centered at baseband;
for each intermodulation distortion frequency band of the one or more intermodulation distortion frequency bands, circuitry configured to process an intermodulation component in the intermodulation distortion frequency band to provide a digital feedback signal for the intermodulation distortion frequency band centered at a different intermediate frequency; and
combiner circuitry configured to combine the digital feedback signals for the plurality of frequency bands of the concurrent multi-band signal and the digital feedback signals for the one or more intermodulation distortion frequency bands to provide the combined digital feedback signal;
wherein the different intermediate frequencies for the one or more intermodulation distortion frequency bands are selected such that frequency bands of the digital feedback signals for the intermodulation distortion frequency bands do not overlap the frequency bands of the digital feedback signals for the plurality of frequency bands of the concurrent multi-band signal in the combined digital feedback signal.

11. The transmitter of claim 9 wherein the observation receiver comprises:
for each frequency band of the plurality of frequency bands of the concurrent multi-band signal, circuitry configured to process a component of the concurrent multi-band signal in the frequency band to provide a digital feedback signal for the frequency band centered at baseband;
for each intermodulation distortion frequency band of the one or more intermodulation distortion frequency bands, circuitry configured to process an intermodulation component in the intermodulation distortion frequency band to provide a digital feedback signal for the intermodulation distortion frequency band centered at baseband; and
combiner circuitry configured to combine the digital feedback signals for the plurality of frequency bands of the concurrent multi-band signal and the digital feedback signals for the one or more intermodulation distortion frequency bands to provide the combined digital feedback signal.

12. The transmitter of claim 8 further comprising:
an observation receiver configured to process the concurrent multi-band signal output by the power amplifier circuitry to provide a digital feedback signal that is representative of one of the plurality of frequency bands of the concurrent multi-band signal;

wherein the single adaptor is further configured to adaptively configure the plurality of digital predistorters based on the digital feedback signal.

13. The transmitter of claim 1 wherein the memory polynomial based digital baseband model defines a separate set of predistortion coefficients for each of the plurality of digital predistorters.

14. The transmitter of claim 1 wherein:
the memory polynomial based digital baseband model defines a separate set of predistortion coefficients for each of the plurality of digital predistorters; and
for each frequency band of the plurality of frequency bands of the concurrent multi-band signal and the one or more intermodulation distortion frequency bands, the memory polynomial based digital baseband model defines a single coefficient for all terms associated with a same non-linear order and memory depth.

15. The transmitter of claim 1 wherein the memory polynomial based digital baseband model defines a single set of predistortion coefficients for all of the plurality of digital predistorters.

16. The transmitter of claim 1 wherein:
the concurrent multi-band signal is a concurrent dual-band signal such that the plurality of frequency bands of the concurrent multi-band signal is a first frequency band and a second frequency band of the concurrent dual-band signal;
the plurality of digital input signals comprises a first digital input signal for the first frequency band of the concurrent dual-band signal and a second digital input signal for the second frequency band of the concurrent dual-band signal; and
the one or more intermodulation distortion frequency bands are a first third-order intermodulation distortion frequency band and a second third-order intermodulation distortion frequency band such that the one or more intermodulation distortion compensation signals are a first intermodulation distortion compensation signal for the first third-order intermodulation distortion frequency band and a second intermodulation distortion compensation signal for the second third-order intermodulation distortion frequency band.

17. The transmitter of claim 16 wherein:
the plurality of digital predistorters comprises separate digital predistorters for the first frequency band of the concurrent dual-band signal, the second frequency band of the concurrent dual-band signal, the first third-order intermodulation distortion frequency band, and the second third-order intermodulation distortion frequency band; and
the adaptation subsystem comprises two adaptors configured to adaptively configure the plurality of digital predistorters, wherein at least one adaptor of the two adaptors configures at least two of the separate digital predistorters.

18. The transmitter of claim 16 wherein:
the plurality of digital predistorters is four digital predistorters comprising:
a first digital predistorter configured to process the first digital input signal and the second digital input signal to provide a first predistorted digital input signal of the plurality of predistorted digital input signals;
a second digital predistorter configured to process the first digital input signal and the second digital input signal to provide a second predistorted digital input signal of the plurality of predistorted digital input signals;
a third digital predistorter configured to process the first digital input signal and the second digital input signal to provide a first intermodulation distortion compensation signal of the one or more intermodulation distortion compensation signals; and
a fourth digital predistorter configured to process the first digital input signal and the second digital input signal to provide a second intermodulation distortion compensation signal of the one or more intermodulation distortion compensation signals; and
the adaptation subsystem comprises:
a first adaptor configured to adaptively configure the first digital predistorter and the third digital predistorter based on the memory polynomial based digital baseband model of the plurality of digital predistorters; and
a second adaptor configured to adaptively configure the second digital predistorter and the fourth digital predistorter based on the memory polynomial based digital baseband model of the plurality of digital predistorters.

19. The transmitter of claim 18 wherein:
the first adaptor is further configured to adaptively configure the first digital predistorter and the third digital predistorter based on the memory polynomial based digital baseband model of the plurality of digital predistorters and a first combined digital feedback signal for the first frequency band of the concurrent dual-band signal and the first third-order intermodulation distortion frequency band; and
the second adaptor is further configured to adaptively configure the second digital predistorter and the fourth digital predistorter based on the memory polynomial based digital baseband model of the plurality of digital predistorters and a second combined digital feedback signal for the second frequency band of the concurrent dual-band signal and the second third-order intermodulation distortion frequency band.

20. The transmitter of claim 19 further comprising an observation receiver configured to process the concurrent dual-band signal output by the power amplifier circuitry to provide the first and second combined digital feedback signals.

21. The transmitter of claim 18 wherein, for N-th order nonlinearities and M-th order memory depth, the memory polynomial based digital baseband model is represented as:

$$y_{\omega_1}(n) = \sum_{m=0}^{M-1} \sum_{k=0}^{N-1} \sum_{j=0}^{k} c_{k,j,m}^{\omega_1} x_1(n-m)|x_1(n-m)|^{k-j}|x_2(n-m)|^j$$

$$y_{\omega_2}(n) = \sum_{m=0}^{M-1} \sum_{k=0}^{N-1} \sum_{j=0}^{k} c_{k,j,m}^{\omega_2} x_2(n-m)|x_2(n-m)|^{k-j}|x_1(n-m)|^j$$

$$y_{2\omega_1-\omega_2}(n) = \sum_{m=0}^{M-1} \sum_{k=0}^{N-3} \sum_{j=0}^{k} c_{k,j,m}^{2\omega_1-\omega_2} x_1(n-m)^2 x_2(n-m)^*|x_1(n-m)|^{k-j}|x_2(n-m)|^j$$

$$y_{2\omega_2-\omega_1}(n) = \sum_{m=0}^{M-1} \sum_{k=0}^{N-3} \sum_{j=0}^{k} c_{k,j,m}^{2\omega_2-\omega_1} x_2(n-m)^2 x_1(n-m)^*|x_2(n-m)|^{k-j}|x_1(n-m)|^j$$

where $y_{\omega_1}(n)$ denotes the first predistorted digital input signal, $y_{\omega_2}(n)$ denotes the second predistorted digital input signal, $y_{2\omega_1-\omega_2}(n)$ denotes the first intermodulation distortion compensation signal, $y_{2\omega_2-\omega_1}(n)$ denotes the second intermodulation distortion compensation signal, $x_1(n)$ denotes the first digital input signal, $x_2(n)$ denotes the second digital input signal, $c_{k,j,m}^{\omega_1}$ is a set of predistortion coefficients for the first digital predistorter, $c_{k,j,m}^{\omega_2}$ is a set of predistortion coefficients for the second digital predistorter, $c_{k,j,m}^{2\omega_1-\omega_2}$ is a set of predistortion coefficients for the third digital predistorter, and $c_{k,j,m}^{2\omega_2-\omega_1}$ is a set of predistortion coefficients for the fourth digital predistorter.

22. The transmitter of claim 18 wherein, for N-th order nonlinearities and M-th order memory depth, the memory polynomial based digital baseband model is represented as:

$$y_{\omega_1}(n) = \sum_{m=0}^{M-1} \sum_{k=2}^{N-1} g_{k,m}^{\omega_1} x_1(n-m) |a_{k+1}^{\omega_1}|x_1(n-m)| + jb_{k+1}^{\omega_1}|x_k(n-m)||^k$$

$$y_{\omega_2}(n) = \sum_{m=0}^{M-1} \sum_{k=2}^{N-1} g_{k,m}^{\omega_2} x_2(n-m) |a_{k+1}^{\omega_2}|x_2(n-m)| + jb_{k+1}^{\omega_2}|x_k(n-m)||^k$$

$$y_{2\omega_1-\omega_2}(n) = \sum_{m=0}^{M-1} \sum_{k=2}^{N-1} g_{k,m}^{2\omega_1-\omega_2} x_1(n-m)^2$$
$$x_2(n-m)^* |a_{k+1}^{2\omega_1-\omega_2}|x_1(n-m)| + jb_{k+1}^{2\omega_1-\omega_2}|x_2(n-m)||^{k-2}$$

$$y_{2\omega_2-\omega_1}(n) = \sum_{m=0}^{M-1} \sum_{k=2}^{N-1} g_{k,m}^{2\omega_2-\omega_1} x_2(n-m)^2$$
$$x_1(n-m)^* |a_{k+1}^{2\omega_2-\omega_1}|x_2(n-m)| + jb_{k+1}^{2\omega_2-\omega_1}|x_1(n-m)||^{k-2}$$

where $y_{\omega_1}(n)$ denotes the first predistorted digital input signal, $y_{\omega_2}(n)$ denotes the second predistorted digital input signal, $y_{2\omega_1-\omega_2}(n)$ denotes the first intermodulation distortion compensation signal, $y_{2\omega_2-\omega_1}(n)$ denotes the second intermodulation distortion compensation signal, $x_1(n)$ denotes the first digital input signal, $x_2(n)$ denotes the second digital input signal, $g_{k,m}^{\omega_1}$ is a set of predistortion coefficients for the first digital predistorter, $g_{k,m}^{\omega_2}$ is a set of predistortion coefficients for the second digital predistorter, $g_{k,m}^{2\omega_1-\omega_2}$ is a set of predistortion coefficients for the third digital predistorter, $g_{k,m}^{2\omega_2-\omega_1}$ is a set of predistortion coefficients for the fourth digital predistorter, $a_{k+1}^{\omega_1}$ and $b_{k+1}^{\omega_1}$ are predetermined envelope coupling factors between $x_1(n)$ and $x_2(n)$ for the first frequency band, $a_{k+1}^{\omega_2}$ and $b_{k+1}^{\omega_1}$ are predetermined envelope coupling factors between $x_1(n)$ and $x_2(n)$ for the second frequency band, $a_{k+1}^{2\omega_1-\omega_2}$ and $b_{k+1}^{2\omega_2-\omega_2}$ are predetermined envelope coupling factors between $x_1(n)$ and $x_2(n)$ for the first third-order intermodulation distortion frequency band, and $a_{k+1}^{2\omega_2-\omega_1}$ and $b_{k+1}^{2\omega_2-\omega_1}$ are predetermined envelope coupling factors between $x_1(n)$ and $x_2(n)$ for the second third-order intermodulation distortion frequency band.

23. The transmitter of claim 16 wherein:
the plurality of digital predistorters comprises separate digital predistorters for the first frequency band of the concurrent dual-band signal, the second frequency band of the concurrent dual-band signal, the first third-order intermodulation distortion frequency band, and the second third-order intermodulation distortion frequency band; and
the adaptation subsystem comprises a single adaptor configured to adaptively configure the plurality of digital predistorters.

24. The transmitter of claim 16 wherein:
the plurality of digital predistorters is four digital predistorters comprising:

a first digital predistorter configured to process the first digital input signal and the second digital input signal to provide a first predistorted digital input signal of the plurality of predistorted digital input signals;
a second digital predistorter configured to process the first digital input signal and the second digital input signal to provide a second predistorted digital input signal of the plurality of predistorted digital input signals;
a third digital predistorter configured to process the first digital input signal and the second digital input signal to provide a first intermodulation distortion compensation signal of the one or more intermodulation distortion compensation signals; and
a fourth digital predistorter configured to process the first digital input signal and the second digital input signal to provide a second intermodulation distortion compensation signal of the one or more intermodulation distortion compensation signals; and
the adaptation subsystem comprises a single adaptor configured to adaptively configure the first digital predistorter, the second digital predistorter, the third digital predistorter, and the fourth digital predistorter based on the memory polynomial based digital baseband model of the plurality of digital predistorters.

25. The transmitter of claim 24 wherein:
the single adaptor is further configured to adaptively configure the first digital predistorter, the second digital predistorter, the third digital predistorter, and the fourth digital predistorter based on the memory polynomial based digital baseband model of the plurality of digital predistorters and a combined digital feedback signal for the first and second frequency bands of the concurrent dual-band signal and the first and second third-order intermodulation distortion frequency bands.

26. The transmitter of claim 25 further comprising an observation receiver configured to process the concurrent dual-band signal output by the power amplifier circuitry to provide the combined digital feedback signal.

27. The transmitter of claim 24 wherein, for N-th order nonlinearities and M-th order memory depth, the memory polynomial based digital baseband model is represented as:

$$y_{\omega_1}(n) = \sum_{m=0}^{M-1} \sum_{k=0}^{N-1} g_{k,m} x_1(n-m) |a_{k+1}^{(inBand)}|x_1(n-m)| + jb_{k+1}^{(inBand)}|x_2(n-m)||^k$$

$$y_{\omega_2}(n) = \sum_{m=0}^{M-1} \sum_{k=0}^{N-1} g_{k,m} x_2(n-m) |a_{k+1}^{(inBand)}|x_2(n-m)| + jb_{k+1}^{(inBand)}|x_1(n-m)||^k$$

$$y_{2\omega_1-\omega_2}(n) = \sum_{m=0}^{M-1} \sum_{k=2}^{N-1} g_{k,m} x_1(n-m)^2$$
$$x_2(n-m)^* |a_{k+1}^{(IM3)}|x_1(n-m)| + jb_{k+1}^{(IM3)}|x_2(n-m)||^{k-2}$$

$$y_{2\omega_2-\omega_1}(n) = \sum_{m=0}^{M-1} \sum_{k=2}^{N-1} g_{k,m} x_2(n-m)^2$$
$$x_1(n-m)^* |a_{k+1}^{(IM3)}|x_2(n-m)| + jb_{k+1}^{(IM3)}|x_1(n-m)||^{k-2}$$

where $y_{\omega_1}(n)$ denotes the first predistorted digital input signal, $y_{\omega_2}(n)$ denotes the second predistorted digital input signal, $y_{2\omega_1-\omega_2}(n)$ denotes the first intermodulation distortion compensation signal, $y_{2\omega_2-\omega_1}(n)$ denotes the second intermodulation distortion compensation signal, $x_1(n)$ denotes the first digital input signal, $x_2(n)$ denotes the second digital input signal, $g_{k,m}$ is a set of predistortion coefficients for all of the first, second, third, and fourth digital predistorters, $a_{k+1}^{(inBand)}$ and $b_{k+1}^{(inBand)}$ are predetermined envelope coupling factors between $x_1(n)$ and $x_2(n)$ for the first and second digital predistorters for the first and second frequency bands of the concurrent dual-band signal, and $a_{k+1}^{(IM3)}$ and $b_{k+1}^{(IM3)}$ are predetermined envelope coupling factors between $x_1(n)$ and $x_2(n)$ for the third and fourth digital predistorters for the first and second third-order intermodulation distortion frequency bands.

* * * * *